(12) United States Patent
Jin et al.

(10) Patent No.: US 12,166,049 B2
(45) Date of Patent: Dec. 10, 2024

(54) IMAGE SENSOR HAVING A GATE ELECTRODE ON A SEMICONDUCTOR PATTERN SIDE WALL

(71) Applicant: SAMSUNG ELECTRONICS CO., LTD., Suwon-si (KR)

(72) Inventors: Younggu Jin, Osan-si (KR); Eunsub Shim, Hwaseong-si (KR); Jungchak Ahn, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 437 days.

(21) Appl. No.: 17/655,582

(22) Filed: Mar. 21, 2022

(65) Prior Publication Data

US 2022/0302191 A1    Sep. 22, 2022

(30) Foreign Application Priority Data

Mar. 22, 2021  (KR) .................. 10-2021-0036918
Dec. 22, 2021  (KR) .................. 10-2021-0185402

(51) Int. Cl.
*H01L 27/146*  (2006.01)
*H04N 25/704*  (2023.01)

(52) U.S. Cl.
CPC .. *H01L 27/14614* (2013.01); *H01L 27/14621* (2013.01); *H01L 27/14627* (2013.01);
(Continued)

(58) Field of Classification Search
CPC ......... H01L 27/14614; H01L 27/14621; H01L 27/14627; H01L 27/1463; H01L 27/14636;
(Continued)

(56) References Cited

U.S. PATENT DOCUMENTS 8,748,945 B2   6/2014   Shin
8,773,562 B1   7/2014   Fan
(Continued)

FOREIGN PATENT DOCUMENTS

CN   110061022   7/2019
CN   110085612   8/2019
(Continued)

OTHER PUBLICATIONS

1st Office Action dated May 9, 2024 in corresponding TW Patent Application No. 111110381.

*Primary Examiner* — Tony Ko
(74) *Attorney, Agent, or Firm* — F. Chau & Associates, LLC

(57) ABSTRACT

An image sensor is provided. The image sensor includes a semiconductor substrate including a first surface and a second surface opposite to each other. A semiconductor pattern is disposed on the first surface of the semiconductor substrate and it extends in a first direction perpendicular to the first surface. A buried transmission gate electrode is disposed in a transmission gate trench extending from the first surface of the semiconductor substrate to an interior of the semiconductor substrate. A first gate electrode at least partially surrounds a side wall of the semiconductor pattern and has a ring-shaped horizontal cross-section. A color filter is disposed on the second surface of the semiconductor substrate.

20 Claims, 21 Drawing Sheets

(52) U.S. Cl.
CPC .... *H01L 27/1463* (2013.01); *H01L 27/14636* (2013.01); *H01L 27/1464* (2013.01); *H01L 27/14645* (2013.01); *H04N 25/704* (2023.01)

(58) Field of Classification Search
CPC ........... H01L 27/1464; H01L 27/14645; H01L 27/14643; H04N 25/704
See application file for complete search history.

(56) References Cited

U.S. PATENT DOCUMENTS

| | | |
|---|---|---|
| 9,406,714 B2 | 8/2016 | Jung et al. |
| 9,490,283 B2 | 11/2016 | Yu et al. |
| 9,704,911 B2 | 7/2017 | Oh |
| 9,887,219 B2 | 2/2018 | Sano et al. |
| 10,141,232 B2 | 11/2018 | Lee et al. |
| 10,672,824 B2 | 6/2020 | Tsai |
| 10,854,668 B2 | 12/2020 | Tsai |
| 11,728,361 B2 | 8/2023 | Kubo |
| 2017/0179174 A1 | 6/2017 | Yang et al. |
| 2018/0145080 A1* | 5/2018 | Kim ................... H01L 29/4991 |
| 2018/0158860 A1* | 6/2018 | Roy ................... H01L 27/14634 |
| 2020/0020728 A1 | 1/2020 | Ammo et al. |

FOREIGN PATENT DOCUMENTS

| | | |
|---|---|---|
| TW | 201545329 | 12/2015 |
| WO | 2019188043 | 10/2019 |

\* cited by examiner

A3 − A3'

A2 - A2'

IMAGE SENSOR HAVING A GATE ELECTRODE ON A SEMICONDUCTOR PATTERN SIDE WALL

CROSS-REFERENCE TO RELATED APPLICATIONS

This application is based on and claims priority under 35 U.S.C. § 119 to Korean Patent Application No. 10-2021-0036918, filed on Mar. 22, 2021 in the Korean Intellectual Property Office, and Korean Patent Application No. 10-2021-0185402, filed on Dec. 22, 2021 in the Korean Intellectual Property Office, the disclosures of which are incorporated by reference herein in their entireties.

TECHNICAL FIELD

The present disclosure relates to an image sensor, and more particularly, to an image sensor having a gate electrode on a semiconductor pattern side wall.

DISCUSSION OF THE RELATED ART

An image sensor converts an optical image signal into an electrical signal. An image sensor may include a plurality of pixels and each of the plurality of pixels may include an element for registering light, such as a photodiode. The photodiodes may receive incident light to convert the received light into an electrical signal. A pixel circuit outputs a pixel signal by using charge generated in the photodiode. Modern image sensors have a very high resolution which generally means that there are more pixels packed more closely together. As the density of the image sensor increases, a size of each of the plurality of pixels is reduced and sizes of components of the pixel circuit are also reduced, and accordingly, a leakage current may be generated through the pixel circuit, deteriorating the quality of the image sensor.

SUMMARY

An image sensor includes a semiconductor substrate including a first surface and a second surface opposite to each other. A semiconductor pattern is disposed on the first surface of the semiconductor substrate and extends in a first direction perpendicular to the first surface. A buried transmission gate electrode is disposed in a transmission gate trench extending from the first surface of the semiconductor substrate to an inside of the semiconductor substrate. A first gate electrode at least partially surrounds a side wall of the semiconductor pattern and has a ring-shaped horizontal cross-section.

An image sensor includes a semiconductor substrate including a first surface and a second surface opposite to each other. A buried transmission gate electrode is disposed in a transmission gate trench extending from the first surface of the semiconductor substrate to an inside of the semiconductor substrate. A semiconductor pattern is disposed on the first surface of the semiconductor substrate and extends in a first direction perpendicular to the first surface. A first gate electrode is disposed on a side wall of the semiconductor pattern and includes a main electrode portion extending in the first direction and an extention connected to the main electrode portion to extend onto the first surface of the semiconductor substrate.

An image sensor includes a semiconductor substrate including a first surface and a second surface opposite to each other. A semiconductor pattern is disposed on the first surface of the semiconductor substrate and extends in a first direction perpendicular to the first surface. A device isolation layer is provided on the first surface of the semiconductor substrate and defines an active region. A buried transmission gate electrode is spaced apart from the semiconductor pattern in a second direction parallel with the first surface of the semiconductor substrate and is disposed in a transmission gate trench extending to an inside of the semiconductor substrate. A first gate insulating layer at least partially surrounds a side wall of the semiconductor pattern. A first gate electrode includes a main electrode portion at least partially surrounding the side wall of the semiconductor pattern on the first gate insulating layer and has a ring-shaped horizontal cross-section. A first source/drain region is disposed in the semiconductor substrate under the semiconductor pattern. A second source/drain region is disposed in an upper portion of the semiconductor pattern.

BRIEF DESCRIPTION OF THE DRAWINGS

Embodiments of the inventive concept will be more clearly understood from the following detailed description taken in conjunction with the accompanying drawings, in which.

DETAILED DESCRIPTION OF THE EMBODIMENTS

Hereinafter, an embodiment of the inventive concept will be described in detail with reference to the accompanying drawings.

Figure 1:
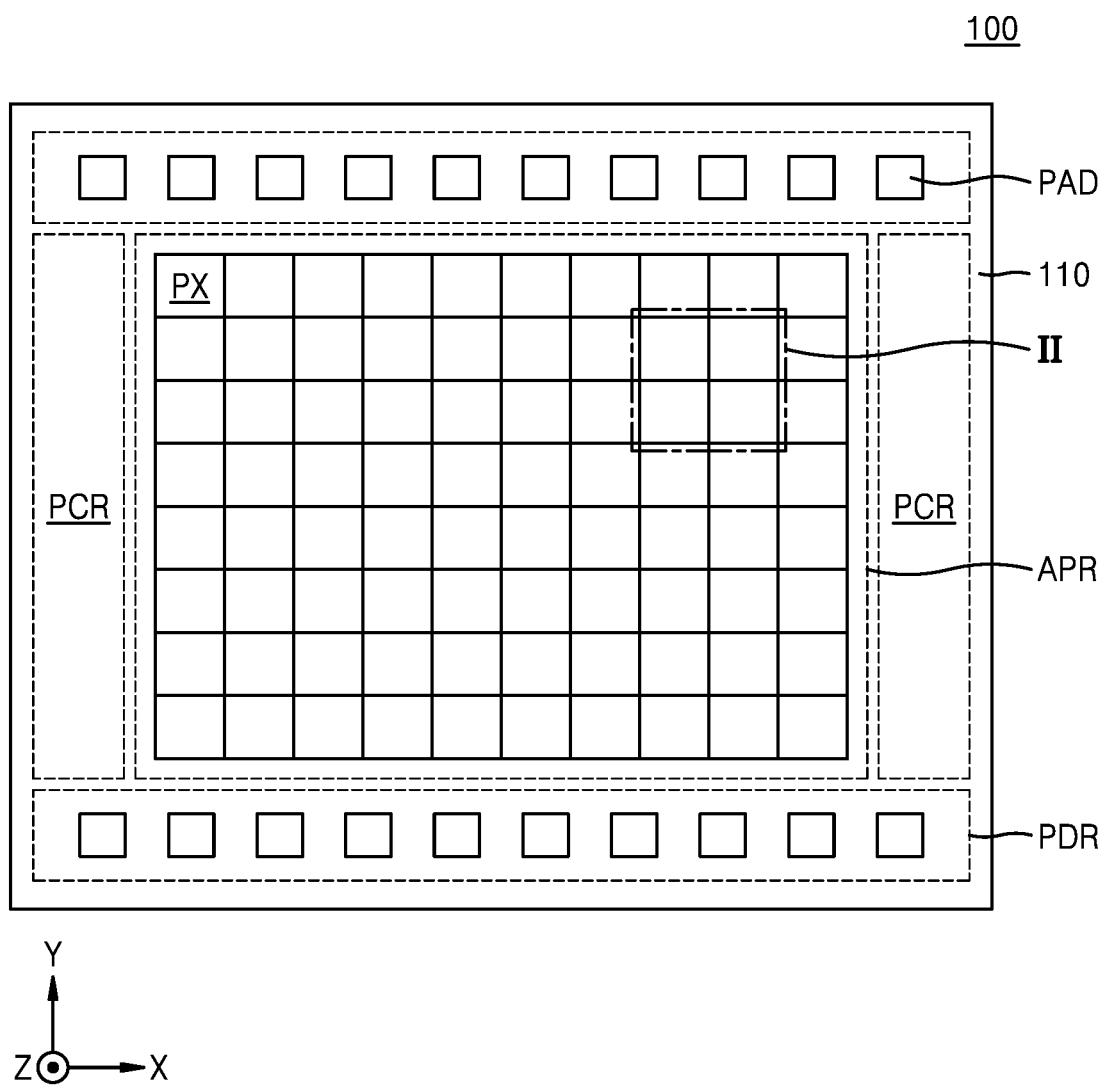
FIG. 1 is a layout diagram illustrating an image sensor according to an embodiment of the present disclosure.
Figure 2:
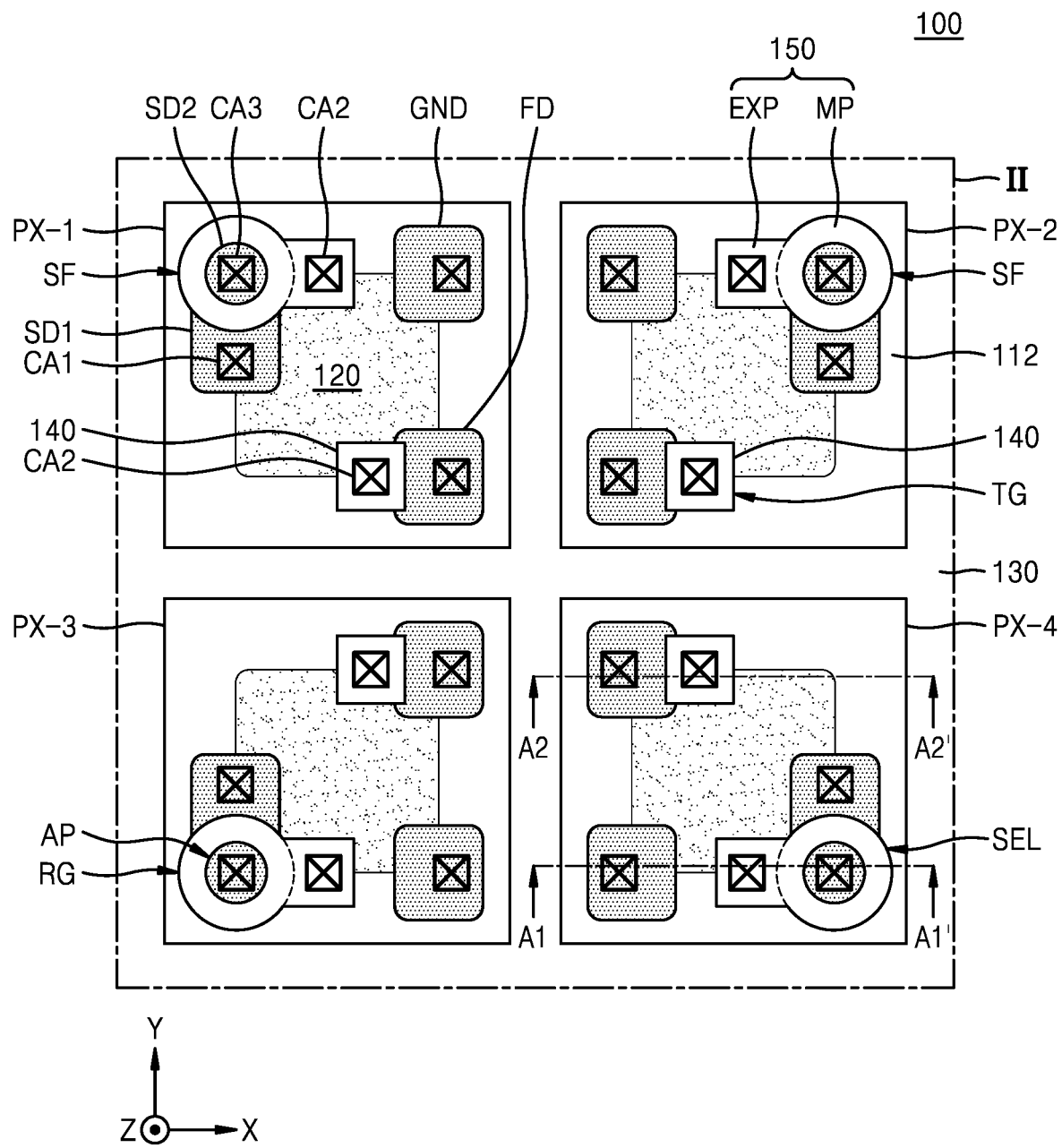
FIG. 2 is an enlarged layout diagram of portion II of FIG. 1.
Figure 3:
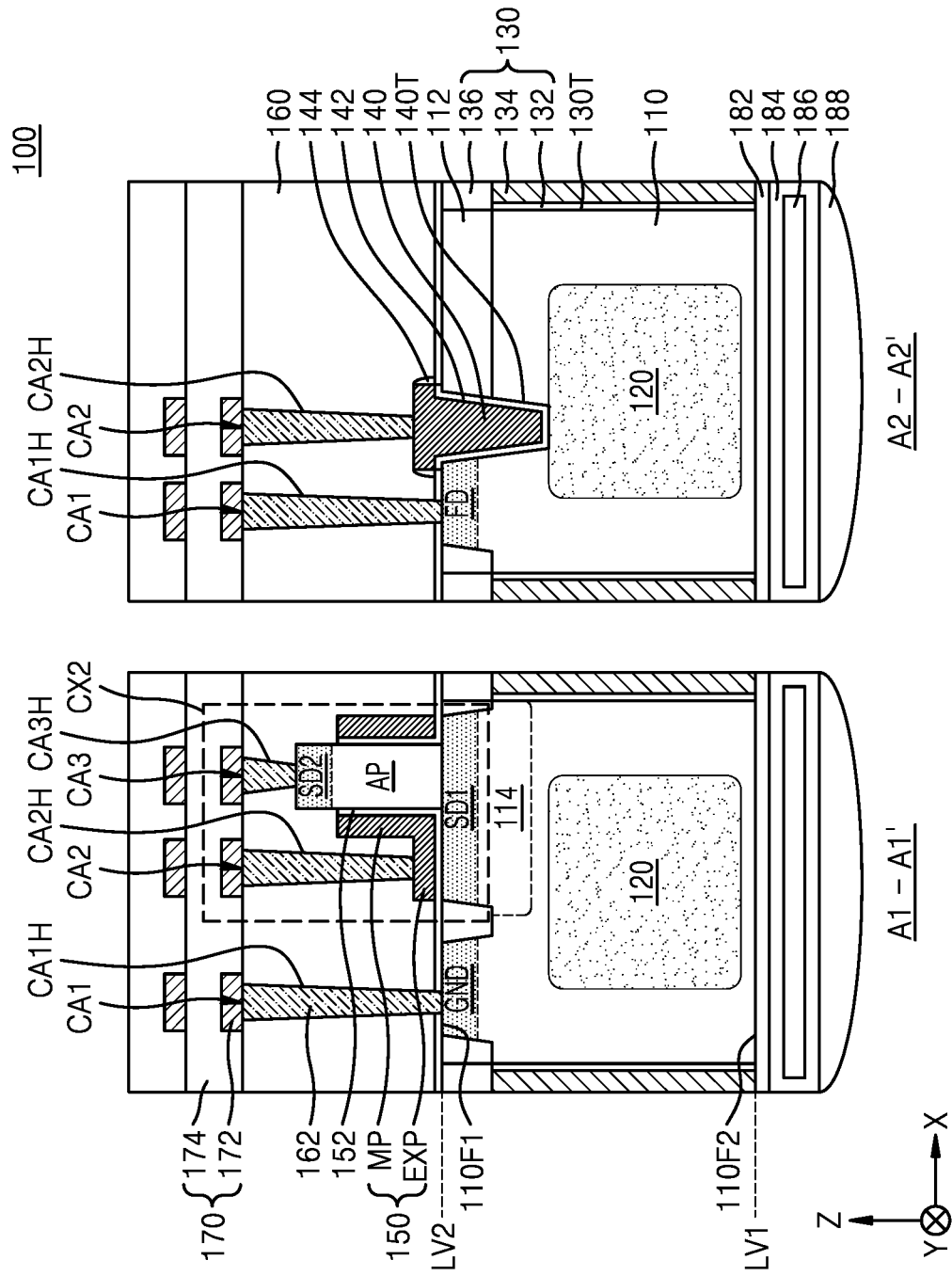
FIG. 3 is a cross-sectional view taken along lines A1-A1' and A2-A2' of FIG. 2.
Figure 4:
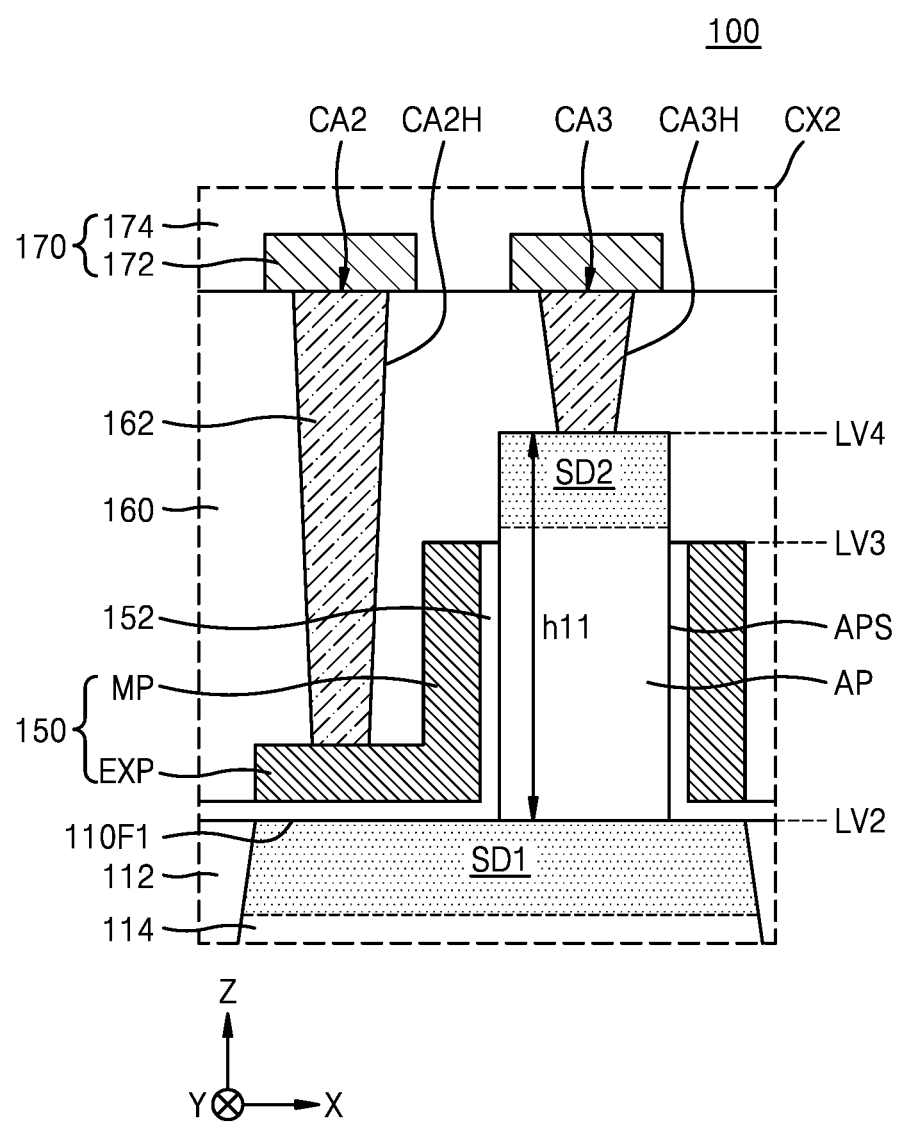
FIG. 4 is an enlarged view of portion CX2 of FIG. 3.
Figure 5A:
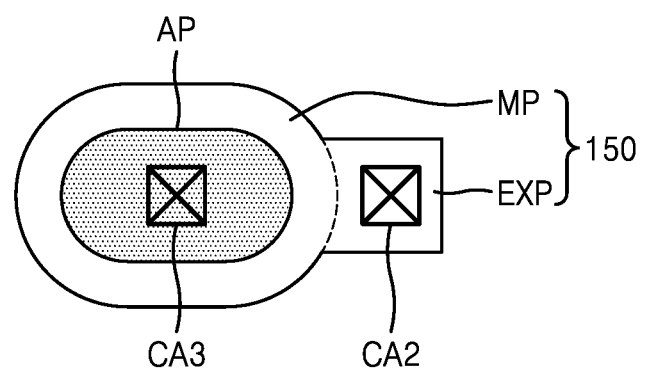
FIGS. 5A and 5B are layout diagrams of a first gate electrode according to an embodiment of the present disclosure.
Figure 5B:
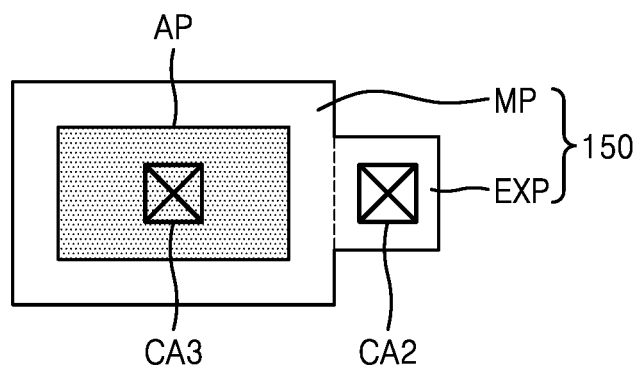

FIG. 1 is a layout diagram illustrating an image sensor 100 according to an embodiment of the present disclosure. FIG. 2 is an enlarged layout diagram of the portion II of FIG. 1. FIG. 3 is a cross-sectional view taken along the lines A1-A1' and A2-A2' of FIG. 2. FIG. 4 is an enlarged view of portion CX2 of FIG. 3. FIGS. 5A and 5B are layout diagrams of a first gate electrode 150 according to an embodiment of the present disclosure. In FIGS. 1 and 2, for convenience sake, only a partial configuration of the image sensor 100 is illustrated and it is to be understood that the image sensor 100 further includes various other elements.

Referring to FIGS. 1 to 5B, the image sensor 100 may include an active pixel region APR, peripheral circuit regions PCR, and pad regions PDR, each formed in a semiconductor substrate 110.

The active pixel region APR may be disposed in the center of the semiconductor substrate 110 and the peripheral circuit regions PCR may be disposed on opposite sides of the active pixel region APR. The pad regions PDR may be disposed at edges of the semiconductor substrate 110.

The active pixel region APR includes a plurality of pixels PX, and a plurality of photoelectric conversion regions 120 may be disposed in the plurality of pixels PX, respectively. In the active pixel region APR, the plurality of pixels PX may be arranged in a matrix of columns and rows in a first direction X parallel with a top surface of the semiconductor substrate 110 and a second direction Y perpendicular to the first direction X and parallel with the top surface of the semiconductor substrate 110.

Figure 19:
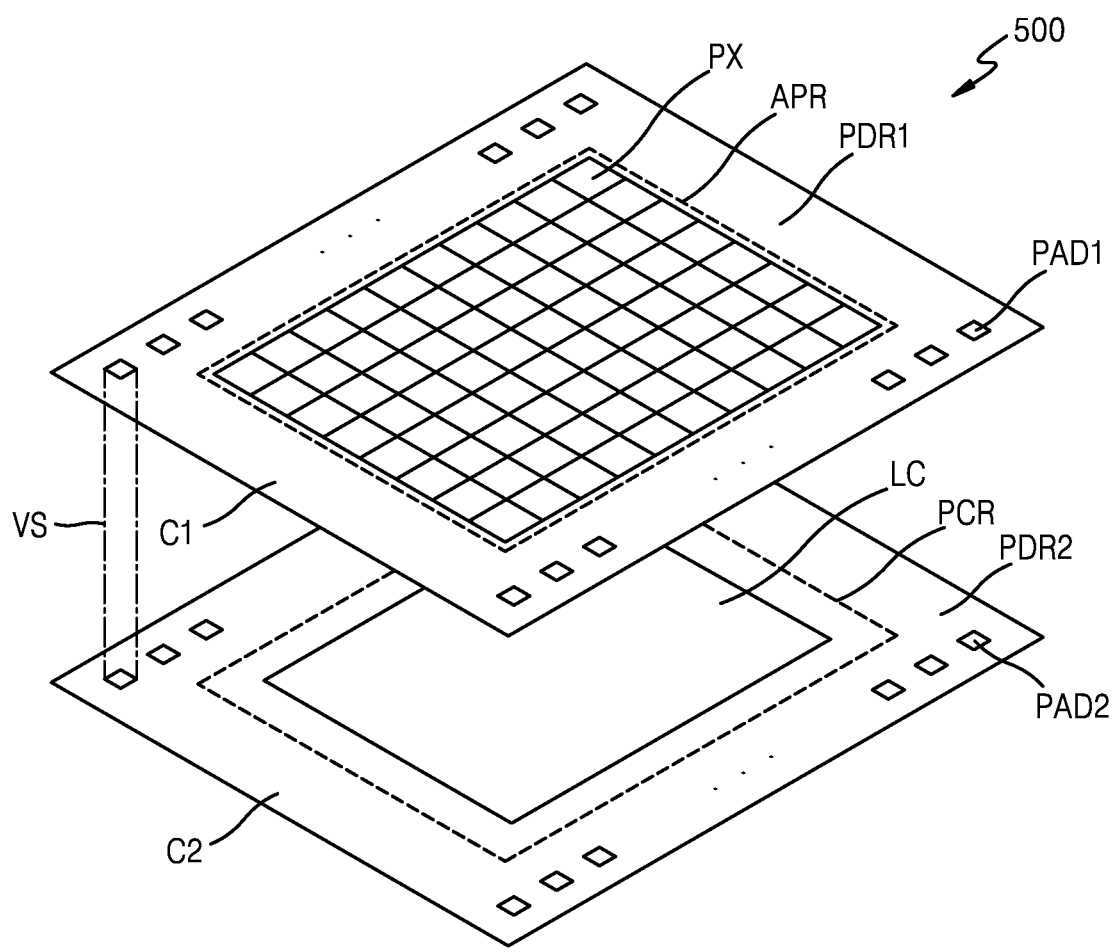
FIG. 19 is a schematic diagram illustrating an image sensor according to an embodiment of the present disclosure.

The peripheral circuit regions PCR are illustrated as being disposed on opposite sides of the active pixel region APR. However, the inventive concept is not necessarily limited thereto and the peripheral circuit regions PCR may at least partially surround the entire active pixel region APR. Alternatively, as illustrated in FIG. 19, a peripheral circuit region PCR may be formed in another substrate and may be connected to the substrate in which the active pixel region APR is formed in stack form. Conductive pads PAD may be disposed in the pad regions PDR. The conductive pads PAD may be disposed at the edges of the semiconductor substrate 110.

The semiconductor substrate 110 may include a first surface 110F1 and a second surface 110F2 opposite to each other. Here, for convenience sake, a surface of the semiconductor substrate 110, on which a color filter 186 is disposed, is referred to as the second surface 110F2 and a surface opposite to the second surface 110F2 is referred to as the first surface 110F1. However, the inventive concept is not necessarily limited thereto.

In embodiments of the present disclosure, the semiconductor substrate 110 may include a p-type semiconductor substrate. For example, the semiconductor substrate 110 may include silicon (Si), germanium (Ge), silicon germanium (SiGe), silicon carbide (SiC), gallium arsenide (GaAs), indium arsenide (InAs), and/or indium phosphide (InP). For example, the semiconductor substrate 110 may inlude a p-type silicon substrate. In embodiments of the present disclosure, the semiconductor substrate 110 may include a p-type bulk substrate and a p-type or n-type epitaxial layer grown thereon. In embodiments of the present disclosure, the semiconductor substrate 110 may include an n-type bulk substrate and a p-type or n-type epitaxial layer grown thereon. Alternatively, the semiconductor substrate 110 may include an organic plastic substrate. A well region 114 may be disposed in the semiconductor substrate 110 adjacent to the first surface 110F1 of the semiconductor substrate 110. The well region 114 may be doped with p-type impurities.

In the active pixel region APR, the plurality of pixels PX may be arranged in a matrix in the semiconductor substrate 110. In the plurality of pixels PX, the plurality of photoelectric conversion regions 120 may be disposed, respectively. In the plurality of photoelectric conversion regions 120, light incident from the second surface 110F2 of the semiconductor substrate 110 may be converted into an electrical signal.

In the active pixel region APR, a pixel device isolation layer 130 may be disposed in the semiconductor substrate 110 and the plurality of pixels PX may be defined by the pixel device isolation layer 130. The pixel device isolation layer 130 may be disposed between one of the plurality of photoelectric conversion regions 120 and another neighboring one. The one photoelectric conversion region 120 and the other neighboring photoelectric conversion region 120 may be physically and electrically isolated from each other by the pixel device isolation layer 130. The pixel device isolation layer 130 may be disposed between each pair of the plurality of photoelectric conversion regions 120 arranged in a matrix and may be grid or mesh-shaped in a plan view.

The pixel device isolation layer 130 may be formed in a pixel trench 130T passing through the semiconductor substrate 110 from the first surface 110F1 of the semiconductor substrate 110 to the second surface 110F2 thereof. The pixel device isolation layer 130 may include an insulating layer 132 conformally formed on a side wall of the pixel trench 130T, a conductive layer 134 filling the pixel trench 130T on the insulating layer 132, and an upper insulating layer 136. The upper insulating layer 136 may be disposed in a part of the pixel trench 130T adjacent to the first surface 110F1 of the semiconductor substrate 110. In embodiments of the present disclosure, the upper insulating layer 136 may be formed by etching back parts of the insulating layer 132 and the conductive layer 134 disposed at the entrance of the pixel trench 130T and filling a left space with an insulating material.

In embodiments of the present disclosure, the insulating layer 132 may include metal oxide such as hafnium oxide, aluminum oxide, or tantalum oxide. In this case, the insulating layer 132 may operate as a negative fixed charge layer. However, the inventive concept is not necessarily limited thereto. In embodiments of the present disclosure, the insulating layer 132 may include an insulating material such as silicon oxide, silicon nitride, or silicon oxynitride. The conductive layer 134 may include doped polysilicon, metal, metal silicide, metal nitride, and/or a metal-containing layer.

In FIG. 3, the pixel device isolation layer 130 is illustrated as extending through the semiconductor substrate 110 from the first surface 110F1 of the semiconductor substrate 110 to the second surface 110F2 thereof. However, in embodiments of the present disclosure, unlike what is shown in FIG. 3, the pixel device isolation layer 130 may extend from the second surface 110F2 of the semiconductor substrate 110 to an inside of the semiconductor substrate 110 and might not be exposed to the first surface 110F1 of the semiconductor substrate 110. In this case, a barrier doping region may be formed between one end of the pixel device isolation layer 130 adjacent to the first surface 110F1 and the first surface 110F1 and the barrier doping region may be doped with p-type impurities in high concentration.

As illustrated in FIG. 3, a device isolation layer 112 defining an active region may be formed on the first surface 110F1 of the semiconductor substrate 110. The device isolation layer 112 may be disposed in an isolation trench formed in the first surface 110F1 of the semiconductor substrate 110 to a predetermined depth and may include an insulating material. The device isolation layer 112 may at least partially surround upper side walls of the pixel device isolation layer 130 (for example, side walls of the upper insulating layer 136).

Transistors constituting a pixel circuit may be disposed on the active region. The active region may be a part of the semiconductor substrate 110 on which a transmission gate TG, a source follower gate SF, a selection gate SEL, and a reset gate RG are disposed. For example, the active region may include a ground region GND, a floating diffusion region FD, and a first source/drain region SD1. The ground region GND, the floating diffusion region FD, and the first source/drain region SD1 may be spaced apart from one another by the device isolation layer 112.

In some embodiments of the present disclosure, as illustrated in FIG. 2, a first pixel PX-1, a second pixel PX-2, a third pixel PX-3, and a fourth pixel PX-4 may be arranged in a matrix form, the first pixel PX-1 and the third pixel PX-3 arranged side by side in the second direction Y may be mirror-symmetrical with respect to each other, and the first pixel PX-1 and the second pixel PX-2 arranged side by side in the first direction X may be mirror-symmetrical with respect to each other.

In some embodiments of the present disclosure, each of the first pixel PX-1 and the second pixel PX-2 may include the transmission gate TG and the source follower gate SF, the third pixel PX-3 may include the transmission gate TG and the reset gate RG, and the fourth pixel PX-4 may include the transmission gate TG and the selection gate SEL. However, in FIG. 2, only a layout of transistors according to some embodiments is illustrated and the layout of the transistors or a shape of the active region ACT is not necessarily limited thereto.

In embodiments of the present disclosure, the transmission gate TG may constitute a transmission transistor TX (refer to FIG. 6) and the transmission transistor TX may transmit charge generated by the photoelectric conversion region 120 to the floating diffusion region FD. The reset gate RG may constitute a reset transistor RX (refer to FIG. 6) and the reset transistor RX may periodically reset the charge stored in the floating diffusion region FD. The source follower gate SF may constitute a drive transistor DX (refer to FIG. 6) and the drive transistor DX may serve as a source follower buffer amplifier and may buffer a signal in accordance with the charge that is charged or stored in the floating diffusion region FD. The selection gate SEL may constitute a selection transistor SX (refer to FIG. 6) and the selection transistor SX may serve as switching and addressing for selecting a pixel PX.

As illustrated in FIG. 3, the transmission gate TG may be referred to as a buried transmission gate electrode 140 and the buried transmission gate electrode 140 may be disposed in a transmission gate trench 140T extending from the first surface 110F1 of the semiconductor substrate 110 to the inside of the semiconductor substrate 110. A transmission gate insulating layer 142 may be conformally disposed on an internal wall of the transmission gate trench 140T and the buried transmission gate electrode 140 may fill the transmission gate trench 140T on the transmission gate insulating layer 142.

For example, a top surface of the buried transmission gate electrode 140 may be at a level higher than that of the first surface 110F1 of the semiconductor substrate 110 and a transmission gate spacer 144 may be disposed on a side wall of the buried transmission gate electrode 140.

In embodiments of the present disclosure, the buried transmission gate electrode 140 may include doped polysilicon, a metal, a metal silicide, a metal nitride, and/or a metal-containing layer. The transmission gate insulating layer 142 may include silicon oxide or metal oxide and the transmission gate spacer 144 may include silicon nitride, silicon oxynitride, or silicon oxide.

The reset gate RG, the source follower gate SF, and the selection gate SEL may be referred to as a first gate electrode 150 and the first gate electrode 150 may at least partially surround a side wall APS of a semiconductor pattern AP disposed on the first surface 110F1 of the semiconductor substrate 110. The semiconductor pattern AP and the first gate electrode 150 at least partially surrounding the semiconductor pattern AP may constitute a gate-all-around type transistor.

The semiconductor pattern AP may extend from the first surface 110F1 of the semiconductor substrate 110 in a vertical direction Z. For example, the semiconductor pattern AP may include one of Si, Ge, SiGe, SiC, GaAs, InAs, and InP.

In embodiments of the present disclosure, the semiconductor pattern AP may include a material layer epitaxially grown by using the first surface 110F1 of the semiconductor substrate 110 as a seed layer. In embodiments of the present disclosure, the semiconductor pattern AP is a part of the semiconductor substrate 110, may be formed by etching the semiconductor substrate 110 by a predetermined thickness after forming a mask pattern on the first surface 110F1 of the semiconductor substrate 110, and may be a part of the semiconductor substrate 110 remaining unetched to protrude from the first surface 110F1 of the semiconductor substrate 110 in the vertical direction Z.

For example, the second surface 110F2 of the semiconductor substrate 110 is at a first vertical level LV1 and the first surface 110F1 of the semiconductor substrate 110 is at a second vertical level LV2. Based on the first vertical level LV1, a top surface of the semiconductor pattern AP may be at a third vertical level LV3 that is higher than the second vertical level LV2. For example, a distance from the top surface of the semiconductor pattern AP to the second surface 110F2 of the semiconductor substrate 110 may be greater than that from the first surface 110F1 of the semiconductor substrate 110 to the second surface 110F2 of the semiconductor substrate 110 (e.g., a height of the semiconductor substrate 110).

As illustrated in FIG. 3, the semiconductor pattern AP may have a first height h11 in the vertical direction Z and the first height h11 may range from about 10 nm to about 500 nm. However, the inventive concept is not necessarily limited thereto.

In FIG. 3, it is illustrated that the semiconductor pattern AP has the side wall APS perpendicular to the first surface 110F1 of the semiconductor substrate 110 and a width of the semiconductor pattern AP in the first direction X equals over the first height h11 of the semiconductor pattern AP. However, a slope of the side wall APS of the semiconductor pattern AP may vary in accordance with processes of forming the semiconductor pattern AP. For example, a mold layer having an opening may be formed on the first surface 110F1 of the semiconductor substrate 110 and the semiconductor pattern AP may be formed in the mold layer by an epitaxial process. In this case, a width of the top surface of the semiconductor pattern AP may be greater than that of a bottom surface of the semiconductor pattern AP. When the semiconductor pattern AP is formed by etching the first surface 110F1 of the semiconductor pattern AP by a predetermined thickness, the width of the top surface of the semiconductor pattern AP may be less than that of the bottom surface of the semiconductor pattern AP.

In FIG. 2, the semiconductor pattern AP is illustrated as having a substantially circular horizontal cross-section. However, in embodiments of the present disclosure, as illustrated in FIG. 5A, the semiconductor pattern AP may have an elliptical horizontal cross-section. For example, the width of the semiconductor pattern AP in the first direction X may be greater than that of the semiconductor pattern AP in the second direction Y (or the width of the semiconductor pattern AP in the first direction X may be less than that of the semiconductor pattern AP in the second direction Y). In embodiments of the present disclosure, as illustrated in FIG. 5B, the semiconductor pattern AP may have a rectangular horizontal cross-section. However, a shape of the horizontal cross-section of the semiconductor pattern AP is not necessarily limited thereto.

The first gate electrode 150 may at least partially surround the side wall APS of the semiconductor pattern AP on the first surface 110F1 of the semiconductor substrate 110. For example, the first gate electrode 150 may include a main electrode portion MP at least partially surrounding the side wall APS of the semiconductor pattern AP and an extension portion EXP extending from the main electrode portion MP in a horizontal direction and disposed on the first surface 110F1 of the semiconductor substrate 110. For example, the main electrode portion MP may extend to a fourth vertical level LV4 lower than the top surface of the semiconductor pattern AP on the side wall APS of the semiconductor pattern AP in the vertical direction Z. In a plan view, the main electrode portion MP may be ring-shaped to at least partially surround the entire side wall APS of the main electrode portion MP.

The extension portion EXP may be formed on the first surface 110F1 of the semiconductor substrate 110 at a flat top level and with a predetermined width. A contact 162 (for example, a second contact CA2) may be disposed on the extension portion EXP so that an electrical signal may be applied to the first gate electrode 150 through the contact 162. As the first gate electrode 150 includes an extension portion EXP having a flat top surface extending from the main electrode portion MP, defect may be prevented from occurring in a process of forming the contact 162 for the first gate electrode 150. In embodiments of the present disclosure, the top surface of the extension portion EXP may be at the same level as that of the top surface of the buried transmission gate electrode 140. However, the inventive concept is not necessarily limited thereto.

The first gate insulating layer 152 may be interposed between the semiconductor pattern AP and the first gate electrode 150 and may at least partially surround the side wall APS of the semiconductor pattern AP. The first gate insulating layer 152 may extend from the side wall APS of the semiconductor pattern AP to the first surface 110F1 of the semiconductor substrate 110. However, the inventive concept is not necessarily limited thereto. The first gate insulating layer 152 may include a continuous material layer extending to an inside of the transmission gate trench 140T and connected to the transmitting gate insulating layer 142. Alternatively, the first gate insulating layer 152 may extend onto the first surface 110F1 of the semiconductor substrate 110, might not extend to the inside of the transmission gate trench 140T, and may include a material layer separate from the transmission gate insulating layer 142.

The semiconductor pattern AP may be disposed on the first source/drain region SD1, an upper portion of the semiconductor pattern AP might not be covered with the main electrode portion MP, and a second source/drain region SD2 may be disposed in the upper portion of the semiconductor pattern AP. The first source/drain region SD1 and the second source/drain region SD2 may be doped with high concentration impurities. For example, the semiconductor pattern AP, the main electrode portion MP of the first gate electrode 150, and first source/drain region SD1 and the second source/drain region SD2 may constitute a gate-all-around type transistor.

In embodiments of the present disclosure, the first gate electrode 150 may include doped polysilicon, a metal, a metal silicide, a metal nitride, and/or a metal-containing layer. The first gate insulating layer 152 may include silicon oxide or a metal oxide. However, the inventive concept is not necessarily limited thereto.

A buried insulating layer 160 may be disposed on the first surface 110F1 of the semiconductor substrate 110. The buried insulating layer 160 may cover the ground region GND, the floating diffusion region FD, the device isolation layer 112, the buried transmission gate electrode 140, the semiconductor pattern AP, and the first gate electrode 150. The buried insulating layer 160 may be formed to a height sufficient to cover the top surfaces of the semiconductor pattern AP and the first gate electrode 150.

In embodiments of the present disclosure, the buried insulating layer 160 may include silicon nitride or silicon oxynitride. In some examples, the buried insulating layer 160 may have a stacked structure of a first insulating layer and a second insulating layer. In other examples, an etch stop layer may be interposed between the buried insulating layer 160 and the first surface 110F1 of the semiconductor substrate 110 and the etch stop layer may include a material having etching selectivity with respect to the buried insulating layer 160.

The contact 162 passing through the buried insulating layer 160 may be disposed on the first surface 110F1 of the semiconductor substrate 110. For example, the contact 162 may be electrically connected to the active region, the buried transmission gate electrode 140, and the first gate electrode 150 through the buried insulating layer 160. The contact 162 may include a first contact CA1, the second contact CA2, and a third contact CA3.

The first contact CA1 may be disposed in a first contact hole CA1H passing through the buried insulating layer 160. The first contact hole CA1H may expose a top surface of the first surface 110F1 of the semiconductor substrate 110, for example, the ground region GND and the floating diffusion region FD. The first contact CA1 may be connected to the ground region GND and the floating diffusion region FD while filling the first contact hole CA1H.

The second contact CA2 may be disposed in a second contact hole CA2H passing through the buried insulating layer 160. The second contact hole CA2H may expose the top surface of the buried transmission gate electrode 140 and the top surface of the first gate electrode 150. For example, the second contact hole CA2H may expose the top surface of the extension portion EXP of the first gate electrode 150. The second contact CA2 may be connected to the top surface of the buried transmission gate electrode 140 and the top surface of the extension portion EXP of the first gate electrode 150 while filling the second contact hole CA2H.

The third contact CA3 may be disposed in a third contact hole CA3H passing through the buried insulating layer 160. The third contact hole CA3H may expose the top surface of the semiconductor pattern AP or a top surface of the second source/drain region SD2. The third contact CA3 may be connected to the second source/drain region SD2 while filling the third contact hole CA3H.

An upper wiring structure 170 may be disposed on the buried insulating layer 160. The upper wiring structure 170 may have a stacked structure of a plurality of layers. The upper wiring structure 170 may include a wiring layer 172 and an insulating layer 174 at least partially surrounding the wiring layer 172. The wiring layer 172 may include polysilicon doped or undoped with impurities, a metal, a metal silicide, a metal nitride, and/or a metal-containing layer. For example, the wiring layer 172 may include tungsten (W), aluminum (Al), copper (Cu), tungsten silicide, titanium (Ti) silicide, tungsten nitride, titanium nitride, or doped polysilicon. The insulating layer 174 may include an insulating material such as silicon oxide, silicon nitride, or silicon oxynitride.

A back insulating layer 182 may be disposed on the second surface 110F2 of the semiconductor substrate 110. The back insulating layer 182 may be disposed substantially over the entire area of the second surface 110F2 of the semiconductor substrate 110 and may contact a top surface of the pixel device isolation layer 130 at the same level as that of the second surface 110F2 of the semiconductor substrate 110. In embodiments of the present disclosure, the back insulating layer 182 may include a metal oxide such as hafnium oxide, aluminum oxide, or tantalum oxide. In embodiments of the present disclosure, the back insulating layer 182 may include an insulating material such as silicon oxide, silicon nitride, silicon oxynitride, or a low-k dielectric material, where a low-k dielectric material is understood as a material having a relatively low dielectric constant such as a dielectric constant lower than that of silicon dioxide.

A passivation layer 184 may be disposed on the back insulating layer 182, and a color filter 186 and a microlens 188 may be disposed on the passivation layer 184. Optionally, a supporting substrate may be further disposed on the first surface 110F1 of the semiconductor substrate 110.

Generally, pixel circuits such as the reset gate RG, the selection gate SEL, and the source follower gate SF are spaced apart from one another in the pixel PX in the horizontal direction. As density of the image sensor increases, because a size of a unit pixel is reduced and sizes of components of the pixel circuit are also reduced, leakage current through the pixel circuit or read noise of the pixel circuit is generated so that quality of the image sensor deteriorates.

However, according to embodiments of the present disclosure, the semiconductor pattern AP may extend in the vertical direction Z and the first gate electrode 150 may have a gate-all-around structure at least partially surrounding the side wall of the semiconductor pattern AP. Therefore, leakage current of the pixel circuits such as the reset gate RG, the selection gate SEL, and the source follower gate SF may be reduced and read noise may be reduced or prevented from being generated. Therefore, the image sensor 100 may have high image quality. In addition, as the semiconductor pattern AP and the first gate electrode 150 extend in the vertical direction Z, an area of the unit pixel may be reduced and the image sensor 100 may be miniaturized.

Figure 6:
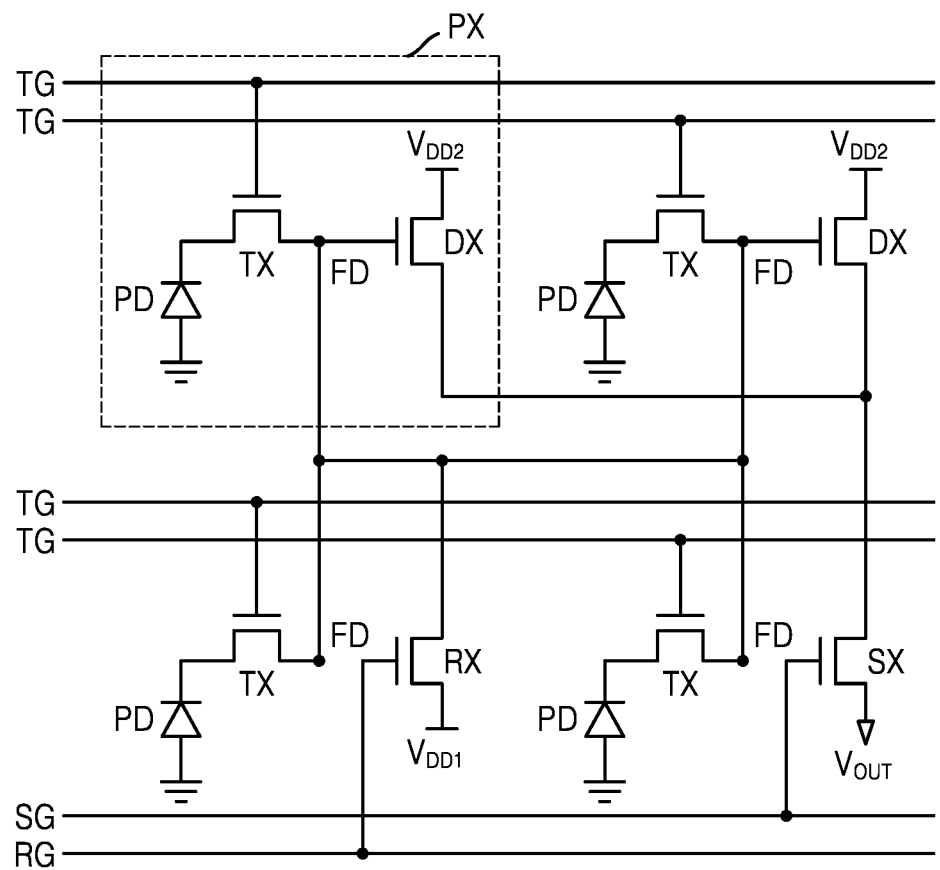
FIG. 6 is an equivalent circuit diagram of a plurality of pixels of an image sensor according to an embodiment of the present disclosure.

FIG. 6 is an equivalent circuit diagram of a plurality of pixels PX of an image sensor 100 according to an embodiment of the present disclosure.

Referring to FIG. 6, the plurality of pixels PX may be arranged in a matrix. Each of the plurality of pixels PX may include a transmission transistor TX and logic transistors. Here, the logic transistors may include a reset transistor RX, a selection transistor SX, and a drive transistor DX (or a source follower transistor). The reset transistor RX may include a reset gate RG and the selection transistor SX may include a selection gate SEL, and the drive transistor DX may include a source follower gate SF, and the transmission transistor TX may include a transmission gate TG.

Each of the plurality of pixels PX may further include a photoelectric conversion element PD and a floating diffusion region FD. The photoelectric conversion element PD may correspond to the photoelectric conversion region 120 illustrated in FIGS. 1 to 4. The photoelectric conversion element PD may generate and accumulate photocharge in proportion to an amount of light incident from the outside and a photo diode, a photo transistor, a photo gate, a pinned photo diode (PPD), or a combination thereof may be used as the photoelectric conversion element PD.

The transmission gate TG may transmit charge generated by the photoelectric conversion element PD to the floating diffusion region FD. The floating diffusion region FD may receive the charge generated by the photoelectric conversion element PD and may store the received charge. The drive transistor DX may be controlled in accordance with an amount of the photocharge accumulated in the floating diffusion region FD.

The reset transistor RX may periodically reset the charge accumulated in the floating diffusion region FD. A drain electrode of the reset transistor RX is connected to the floating diffusion region FD and a source electrode thereof is connected to a power supply voltage $V_{DD1}$. When the reset transistor RX is turned on, the power supply voltage $V_{DD1}$ connected to the source electrode of the reset transistor RX is transmitted to the floating diffusion region FD. When the reset transistor RX is turned on, the charge accumulated in the floating diffusion region FD may be discharged to reset the floating diffusion region FD.

The drive transistor DX is connected to an external current source outside the plurality of pixels PX to function as a source follower buffer amplifier, amplifies a potential change in the floating diffusion region FD, and outputs the amplified potential change to an output line VOUT.

The selection transistor SX may select a plurality of pixels PX in units of rows and, when the selection transistor SX is turned on, a power supply voltage $V_{DD2}$ may be transmitted to a source electrode of the drive transistor DX.

Figure 7:
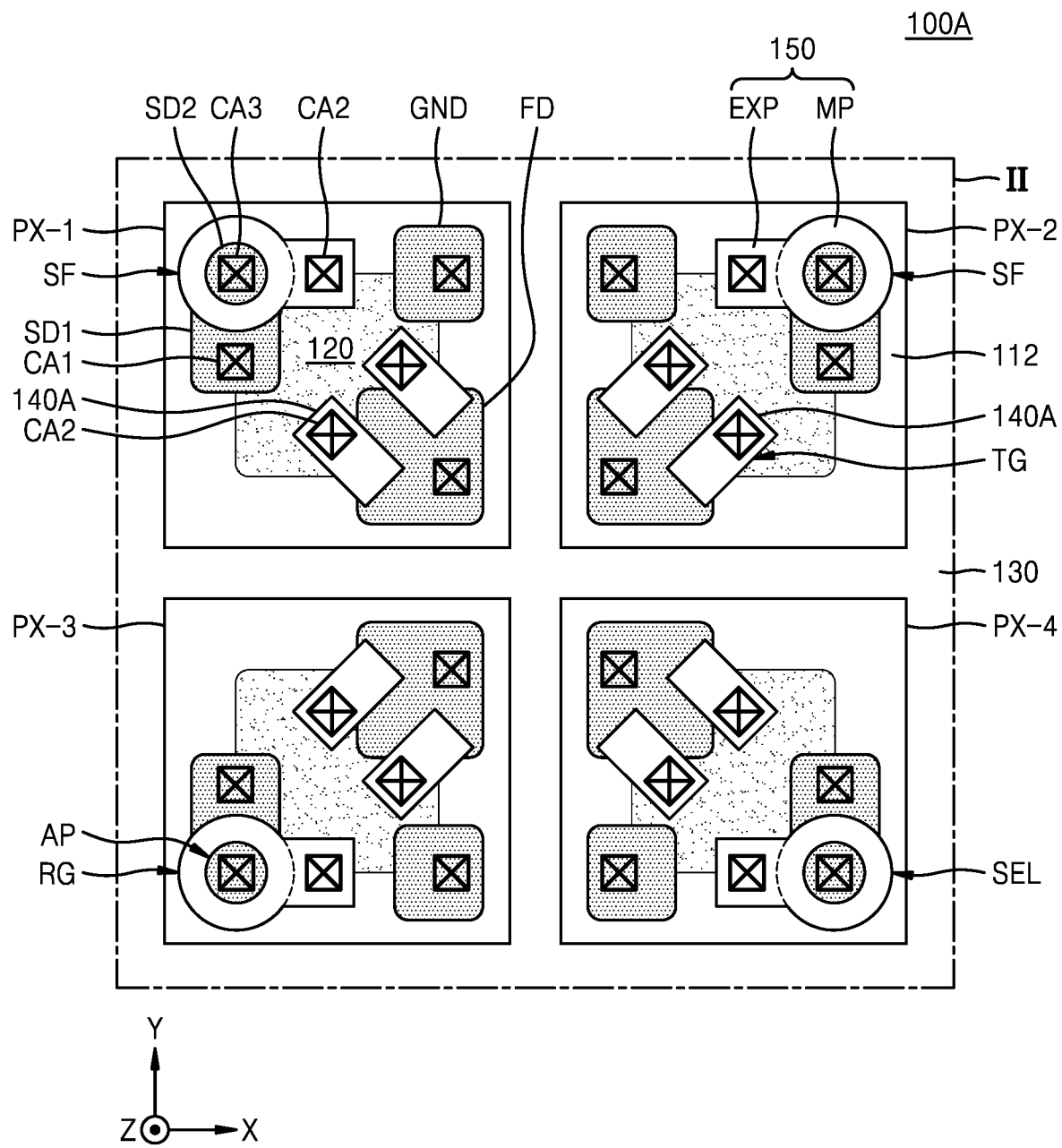
FIG. 7 is a layout diagram illustrating an image sensor according to an embodiment of the present disclosure.

FIG. 7 is a layout diagram illustrating an image sensor 100A according to an embodiment of the present disclosure. In FIG. 7, the same reference numerals as those of FIGS. 1 to 6 may be used to denote the same components.

Referring to FIG. 7, the image sensor 100A may include a transmission gate TG having a dual gate structure. In FIG. 7, a pair of buried transmission gate electrodes 140A may be included instead of the buried transmission gate electrode 140 (refer to FIG. 2) and the pair of buried transmission gate electrodes 140A may be spaced apart from each other by a predetermined distance and may be adjacent to the floating diffusion region FD.

Figure 8:
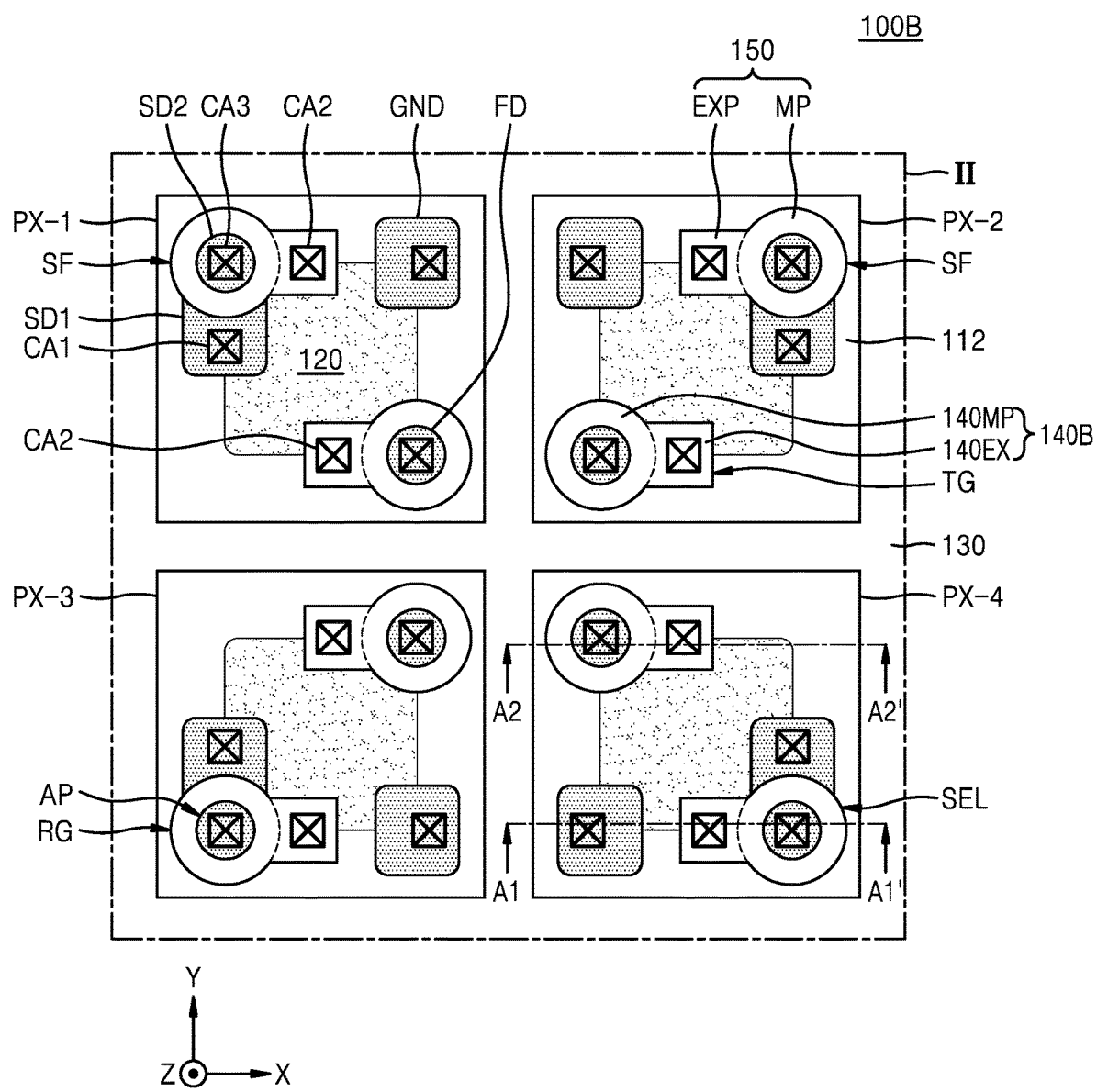
FIG. 8 is a layout diagram illustrating an image sensor according to an embodiment of the present disclosure.
Figure 9:
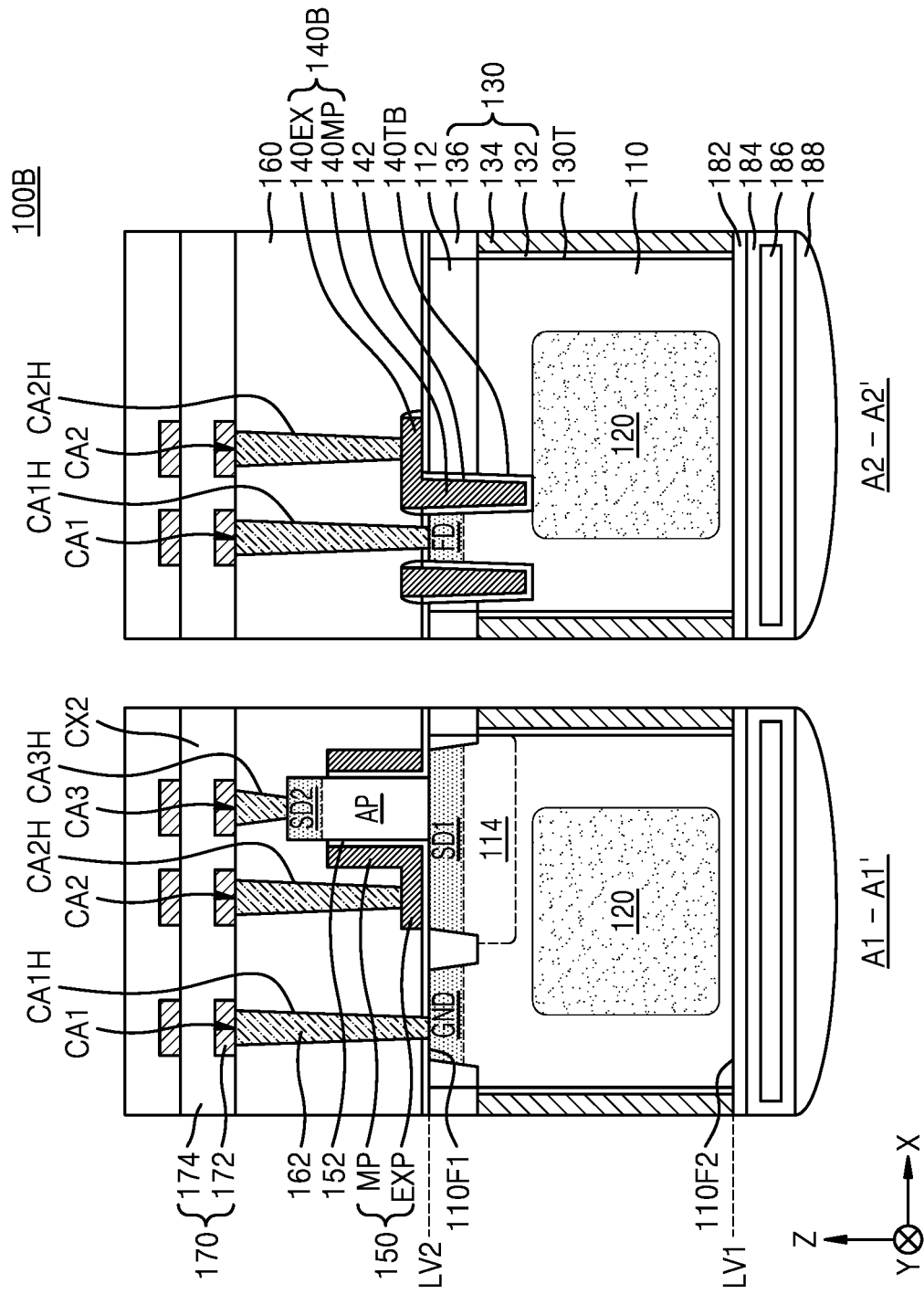
FIG. 9 is a cross-sectional view taken along lines A1-A1' and A2-A2' of FIG. 8.

FIG. 8 is a layout diagram illustrating an image sensor 100B according to an embodiment of the present disclosure and FIG. 9 is a cross-sectional view taken along the lines A1-A1' and A2-A2' of FIG. 8. In FIGS. 8 and 9, the same reference numerals as those of FIGS. 1 to 7 may be used to denote the same components.

Referring to FIG. 8, the image sensor 100B may include a transmission gate TG having a ring-shaped gate structure. A transmission gate trench 140TB may at least partially surround a floating diffusion region FD and may be ring-shaped in a plan view. A buried transmission gate electrode 140B may be disposed in the transmission gate trench 140TB and may at least partially surround the floating diffusion region FD.

In embodiments of the present disclosure, the buried transmission gate electrode 140B may include a main electrode portion 140MP and an extension portion 140EX and the main electrode portion 140MP may be disposed in the transmission gate trench 140TB and may be ring-shaped in a plan view. The extension portion 140EX may extend from the main electrode portion 140MP onto the first surface 110F1 of the semiconductor substrate 110. A contact 162 (for example, a second contact CA2) may be disposed on the extension portion 140EX so that an electrical signal may be applied to the buried transmission gate electrode 140B through the contact 162.

As the buried transmission gate electrode 140B includes the extension portion 140EX having a flat top surface extending from the main electrode portion 140MP, defect may be prevented from occurring in a process of forming the contact 162 for the buried transmission gate electrode 140B. In embodiments of the present disclosure, the top surface of the extension portion 140EX may be at the same level as that of the top surface of the extention portion EXP of the first gate electrode 150. However, the inventive concept is not necessarily limited thereto.

According to embodiments of the present disclosure, as the buried transmission gate electrode 140B at least partially surrounds the floating diffusion region FD, a charge transfer path may be formed in a direction perpendicular to the first surface 110F1 of the semiconductor substrate 110. Therefore, sensitivity at low luminance that may be easily reduced in accordance with a shape of the buried transmission gate electrode 140B may increase so that the image sensor 100B may have high quality.

Figure 10:
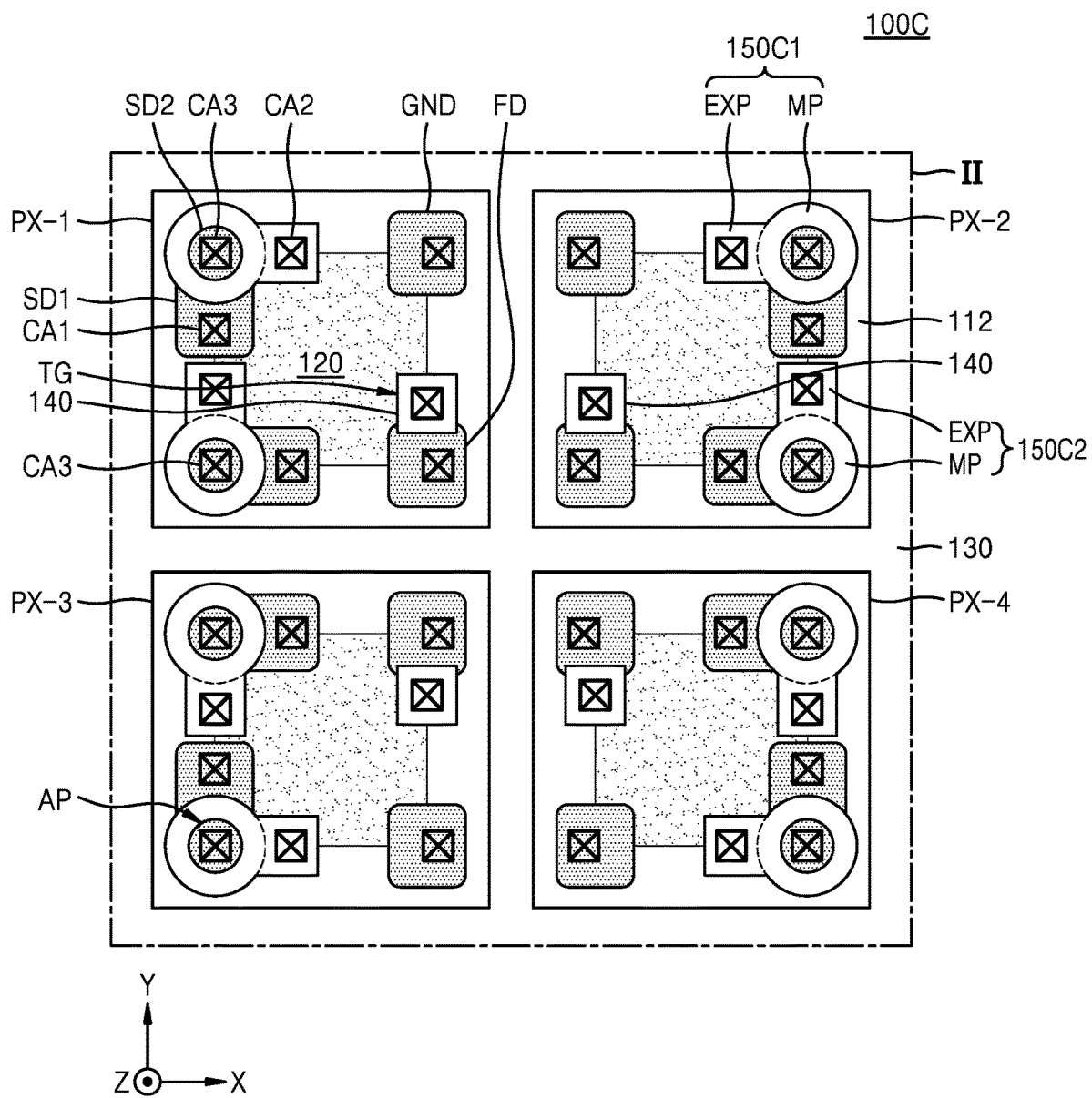
FIG. 10 is a layout diagram illustrating an image sensor according to an embodiment of the present disclosure.

FIG. 10 is a layout diagram illustrating an image sensor 100C according to an embodiment of the present disclosure. In FIG. 10, the same reference numerals as those of FIGS. 1 to 9 may be used to denote the same components.

Referring to FIG. 10, the image sensor 100C may include two semiconductor patterns AP apart from each other in each of pixels PX-1, PX-2, PX-3, and PX-4 and a first gate electrode 150C1 and a second gate electrode 150C2 may be respectively disposed on side walls of the semiconductor patterns AP. For example, each of the first gate electrode 150C1 and the second gate electrode 150C2 may include a main electrode portion MP and an extension portion EXP.

In some examples, the first gate electrode 150C1 may be the source follower gate SF (refer to FIG. 6) and the second gate electrode 150C2 may be the selection gate SEL (refer to FIG. 6). In other examples, the first gate electrode 150C1 may be the reset gate RG (refer to FIG. 6) and the second gate electrode 150C2 may be the selection gate SEL. In other examples, the first gate electrode 150C1 may be the reset gate RG and the second gate electrode 150C2 may be the source follower gate SF.

In FIG. 10, it is illustrated that each of the first to fourth pixels PX-1, PX-2, PX-3, and PX-4 includes the first gate electrode 150C1 and the second gate electrode 150C2. However, one of the first gate electrode 150C1 and the second gate electrode 150C2 may be omitted from at least one of the first to fourth pixels PX-1, PX-2, PX-3, and PX-4.

Figure 11:
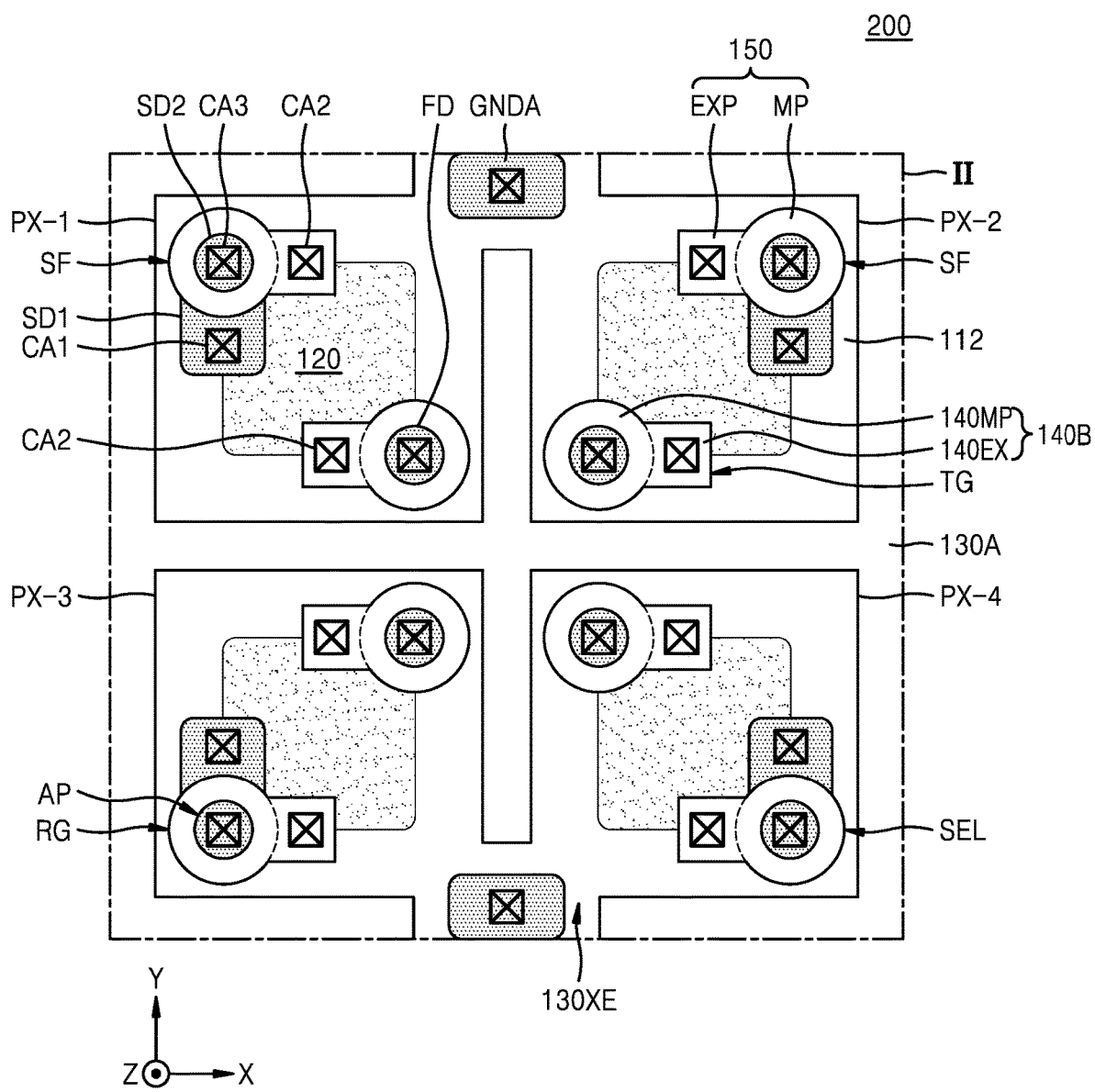
FIG. 11 is a layout diagram illustrating an image sensor according to an embodiment of the present disclosure.

FIG. 11 is a layout diagram illustrating an image sensor 200 according to an embodiment of the present disclosure. In FIG. 11, the same reference numerals as those of FIGS. 1 to 10 may be used to denote the same components.

Referring to FIG. 11, in a plan view, a pixel device isolation layer 130A might not completely surround each of first to fourth pixels PX-1, PX-2, PX-3, and PX-4. A portion of a semiconductor substrate 110 in which the pixel device isolation layer 130A does not surround each of the first to fourth pixels PX-1, PX-2, PX-3, and PX-4 may be referred to as a shared region 130XE. A ground region GNDA may be disposed in the shared region 130XE and, for example, the ground region GNDA may be shared by the first pixel PX-1 and the second pixel PX-2 or the third pixel PX-3 and the fourth pixel PX-4.

In FIG. 11, a buried transmission gate electrode 140B having a ring-shaped horizontal cross-section is illustrated. However, instead of the buried transmission gate electrode 140B, the buried transmission gate electrode 140 (refer to FIGS. 1 to 4) or the buried transmission gate electrode 140A (refer to FIG. 7) may be provided.

Figure 12:
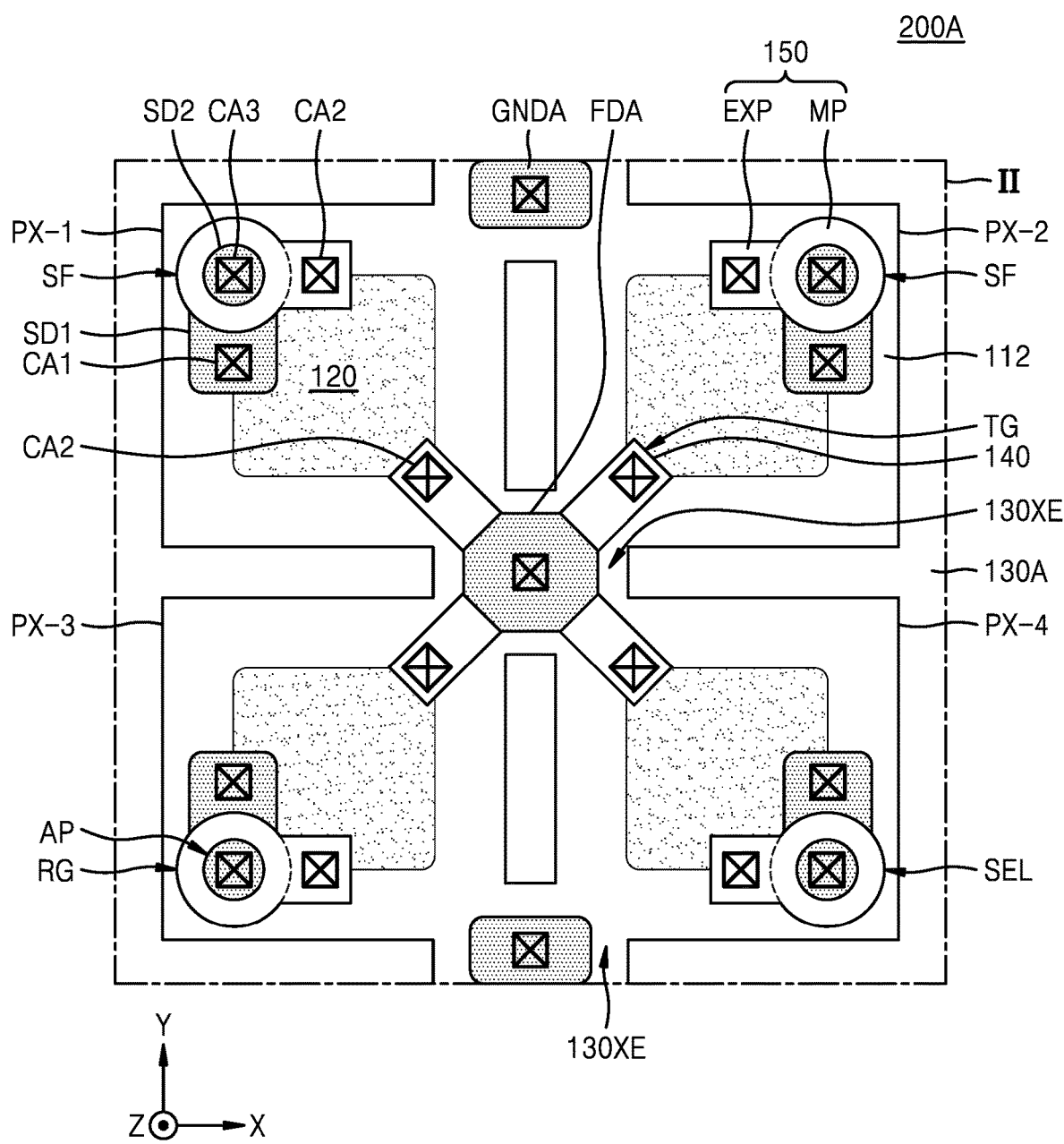
FIG. 12 is a layout diagram illustrating an image sensor according to an embodiment of the present disclosure.

FIG. 12 is a layout diagram illustrating an image sensor 200A according to an embodiment of the present disclosure. In FIG. 12, the same reference numerals as those of FIGS. 1 to 11 may be used to denote the same components.

Referring to FIG. 12, in a plan view, a pixel device isolation layer 130A might not completely surround each of first to fourth pixels PX-1, PX-2, PX-3, and PX-4. A portion of a semiconductor substrate 110 in which the pixel device isolation layer 130A does not surround each of the first to fourth pixels PX-1, PX-2, PX-3, and PX-4 may be referred to as a shared region 130XE. For example, each of the first to fourth pixels PX-1, PX-2, PX-3, and PX-4 may be connected to two shared regions 130XE, a ground region GNDA may be disposed in one shared region 130XE, and a floating diffusion region FDA may be disposed in the other shared region 130XE.

For example, the floating diffusion region FDA may be disposed in a region of the semiconductor substrate 110 in which the first pixel PX-1, the second pixel PX-2, the third pixel PX-3, and the fourth pixel PX-4 meet one another and a buried transmission gate electrode 140 may be disposed in each of the first pixel PX-1, the second pixel PX-2, the third pixel PX-3, and the fourth pixel PX-4 to be adjacent to the floating diffusion region FDA. The floating diffusion region FDA may be shared by the first pixel PX-1, the second pixel PX-2, the third pixel PX-3, and the fourth pixel PX-4.

Figure 13:
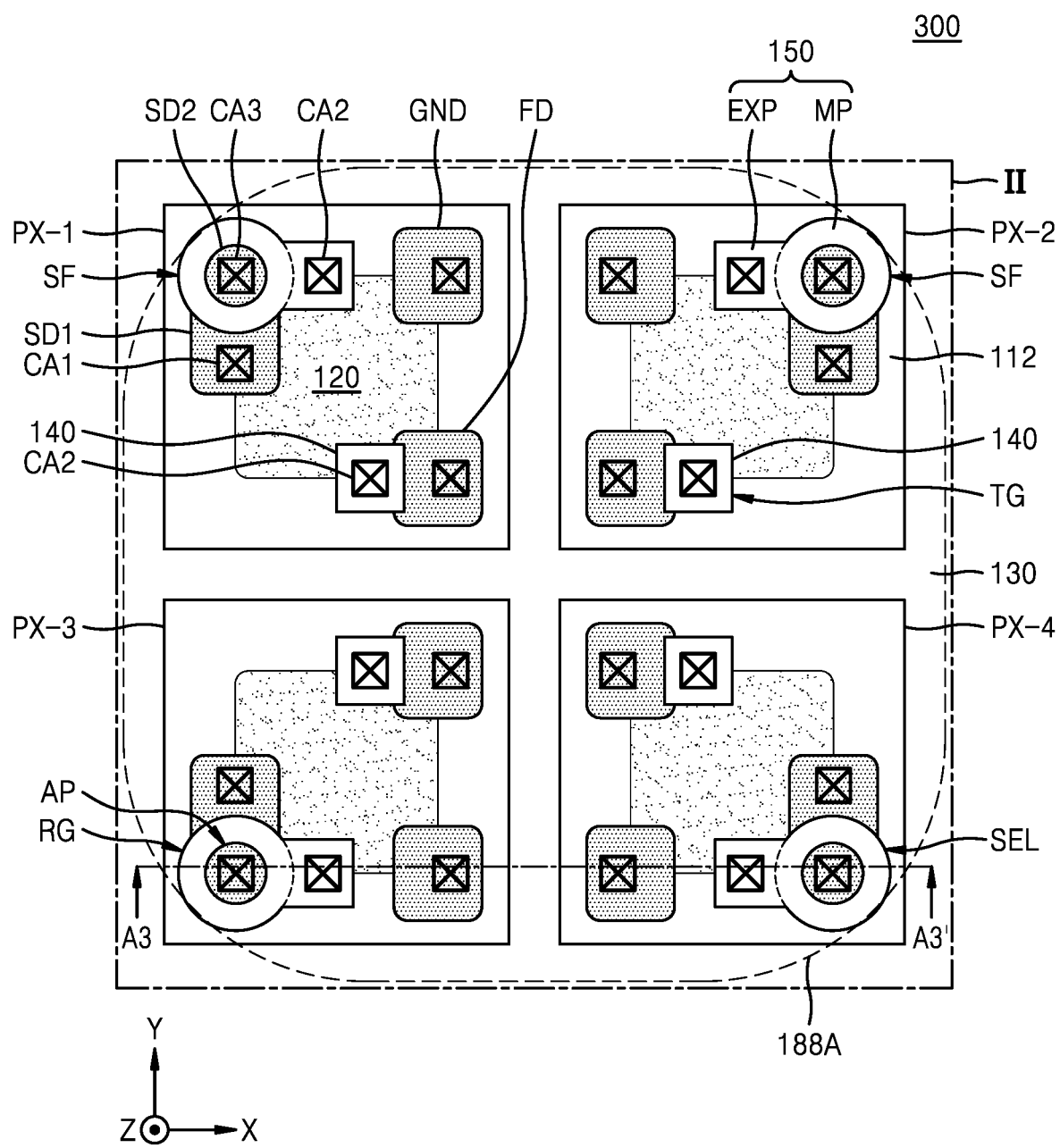
FIG. 13 is a layout diagram illustrating an image sensor according to an embodiment of the present disclosure.
Figure 14:
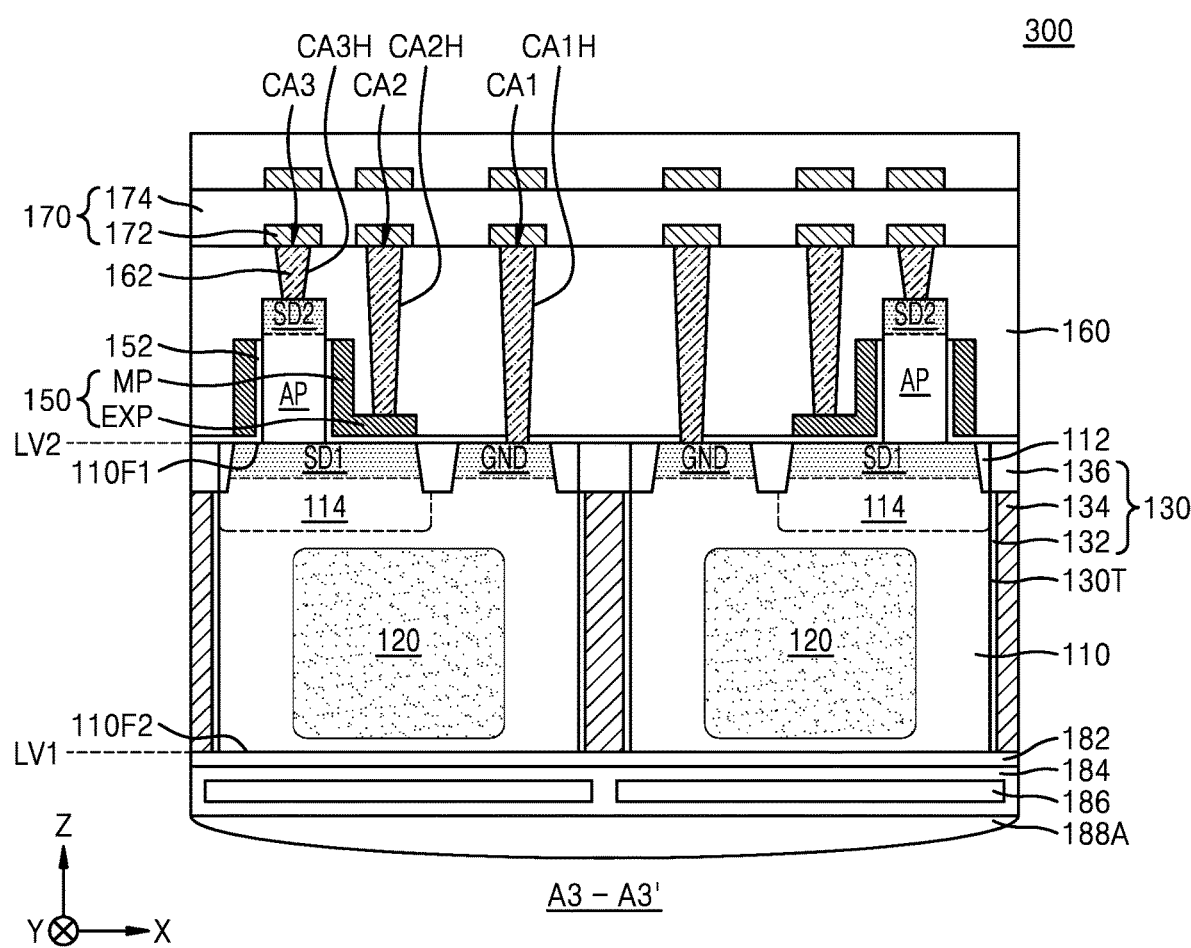
FIG. 14 is a cross-sectional view taken along line A3-A3' of FIG. 13.

FIG. 13 is a layout diagram illustrating an image sensor 300 according to an embodiment of the present disclosure and FIG. 9 is a cross-sectional view taken along the line A3-A3' of FIG. 13. In FIGS. 13 and 14, the same reference numerals as those of FIGS. 1 to 11 may be used to denote the same components.

Referring to FIGS. 12 and 13, the image sensor 300 may include first to fourth pixels PX-1, PX-2, PX-3, and PX-4 for implementing an autofocus (AF) function. For example, the first to fourth pixels PX-1, PX-2, PX-3, and X-4 may be covered with one microlens 188A.

The first to fourth pixels PX-1, PX-2, PX-3, and PX-4 may be phase detection pixels and may generate phase signals used for calculating phase differences among images. The first to fourth pixels PX-1, PX-2, PX-3, and PX-4 may be used for focusing on an object and the phase signals may include information on positions of images focused on the image sensor 300 and may be used for calculating the phase differences among the images. Based on the calculated phase differences, a focus position of a lens of an electronic device provided with the image sensor 300 may be calculated.

Figure 15:
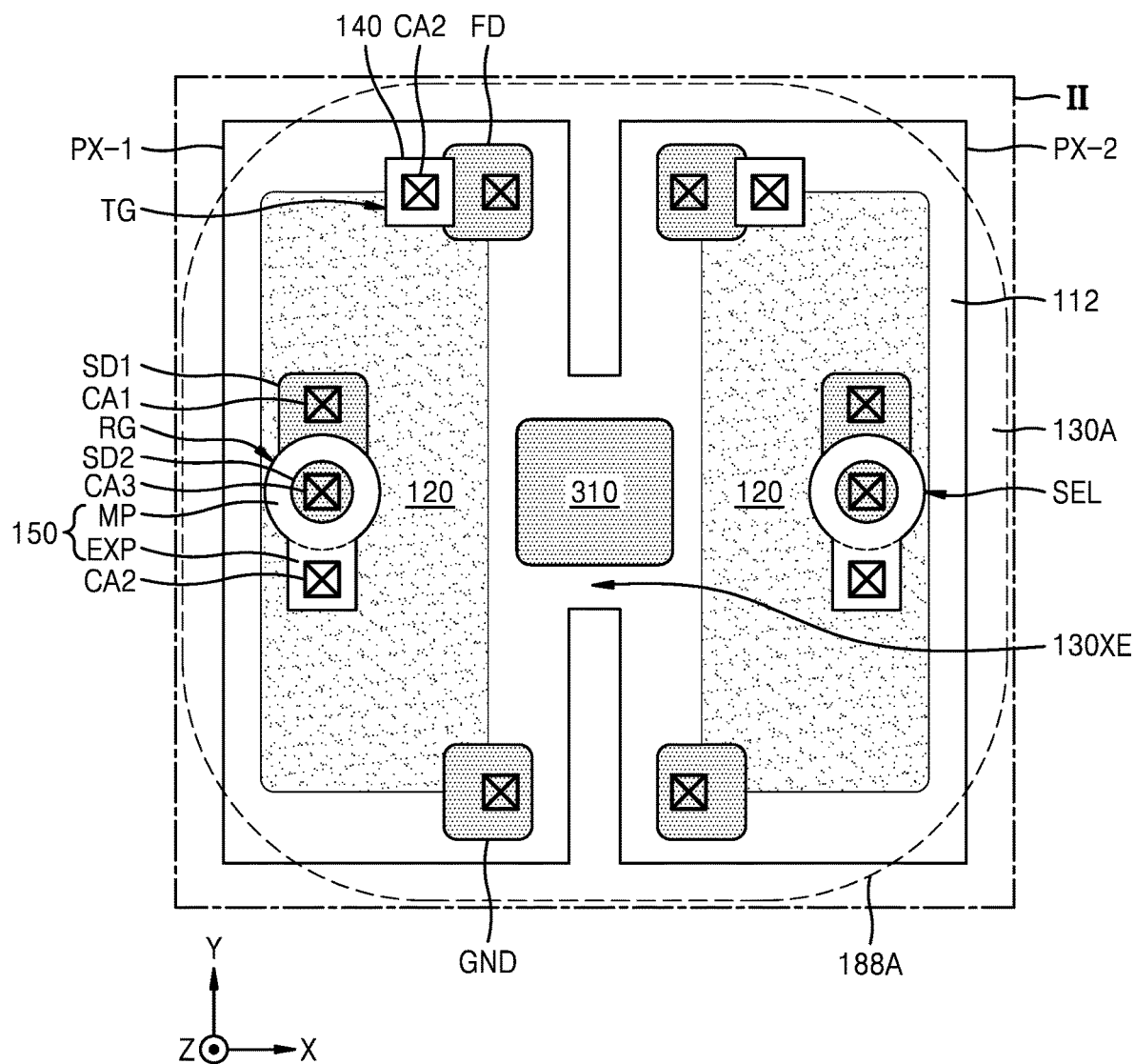
FIG. 15 is a layout diagram illustrating an image sensor according to an embodiment of the present disclosure.

FIG. 15 is a layout diagram illustrating an image sensor 300A according to an embodiment of the present disclosure. In FIG. 15, the same reference numerals as those of FIGS. 1 to 14 may be used to denote the same components.

Referring to FIG. 15, the image sensor 300A may include first and second pixels PX-1 and PX-2 for implementing an AF function. The first pixel PX-1 may include a transmission gate TG and a reset gate RG, the second pixel PX-2 may include a transmission gate TG and a selection gate SEL, and the reset gate RG and the selection gate SEL may include a first gate electrode 150. The first pixel PX-1 and the second pixel PX-2 may be covered with one microlens 188A.

In a plan view, a shared region 130XE that does not completely surround the first pixel PX-1 and the second pixel PX-2 may be disposed in the pixel device isolation layer 130A and an overflow region 310 may be disposed in the shared region 130XE. The overflow region 310 may be disposed in the semiconductor substrate 110 adjacent to the first surface 110F1 of the semiconductor substrate 110. When intensity of photocharge incident on one of the first pixel PX-1 and the second pixel PX-2 is greater, a path in which the photocharge move to a neighboring pixel through the overflow region 310 may be provided.

Figure 16:
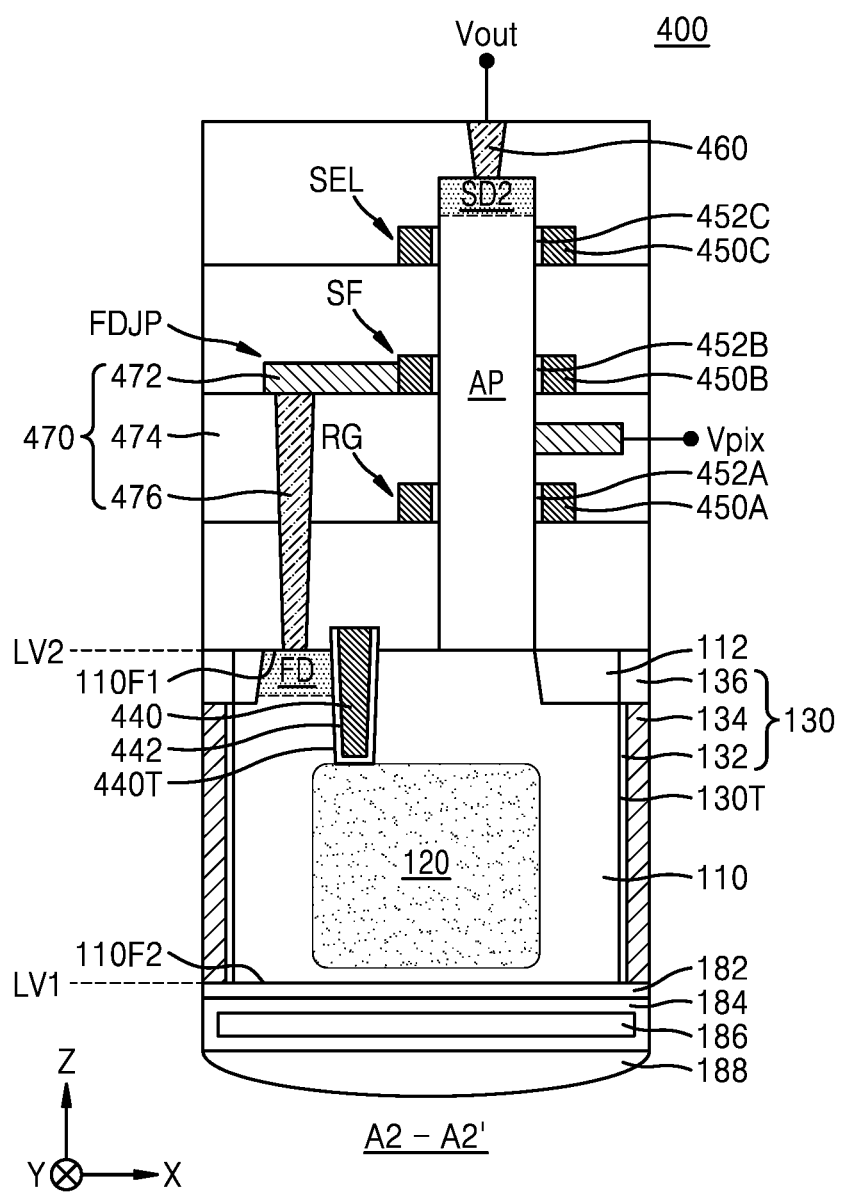
FIG. 16 is a cross-sectional view illustrating an image sensor according to an embodiment of the present disclosure.

FIG. 16 is a cross-sectional view illustrating an image sensor 400 according to an embodiment of the present disclosure. In FIG. 16, the same reference numerals as those of FIGS. 1 to 15 may be used to denote the same components.

Referring to FIG. 16, the image sensor 400 may include a buried transmission gate electrode 440 and a first gate electrode 450A, a second gate electrode 450B, and a third gate electrode 450C disposed on a side wall of a semiconductor pattern AP to be spaced apart from one another in a vertical direction Z.

A transmission gate trench 440T may extend from a first surface 110F1 of a semiconductor substrate 110 to an inside of the semiconductor substrate 110 and the buried transmission gate electrode 440 may be disposed in the transmission gate trench 440T. A transmission gate insulating layer 442 may be further disposed on an internal wall of the transmission gate trench 440T and the buried transmission gate electrode 440 may fill the transmission gate trench 440T on the transmission gate insulating layer 442. A floating diffusion region FD may be disposed in the semiconductor substrate 110 adjacent to the buried transmission gate electrode 440.

The semiconductor pattern AP may be spaced apart from the buried transmission gate electrode 440 in the horizontal direction (for example, the X direction). The first gate electrode 450A, the second gate electrode 450B, and the third gate electrode 450C may be sequentially disposed on the side wall of the semiconductor pattern AP at different vertical levels. Each of the first gate electrode 450A, the second gate electrode 450B, and the third gate electrode 450C may have a ring-shaped horizontal cross-section and may vertically overlap one another.

A first gate insulating layer 452A may be disposed between the first gate electrode 450A and the semiconductor pattern AP, a second gate insulating layer 452B may be disposed between the second gate electrode 450B and the semiconductor pattern AP, and a third gate insulating layer 452C may be disposed between the third gate electrode 450C and the semiconductor pattern AP. In embodiments of the present disclosure, the first to third gate insulating layers 452A, 452B, and 452C may be connected to one another to completely cover the entire side wall of the semiconductor pattern AP.

An upper wiring structure 470 covering the buried transmission gate electrode 440, the semiconductor pattern AP, and the first to third gate electrodes 450A, 450B, and 450C may be disposed on the first surface 110F1 of the semiconductor substrate 110. The upper wiring structure 470 may include a wiring layer 472, an insulating layer 474 at least partially surrounding the wiring layer 472, and a via contact 476 extending in the vertical direction Z through the insulating layer 474.

The floating diffusion region FD and the second gate electrode 450B may be electrically connected to each other by a jumper structure FDJP. For example, the jumper structure FDJP may provide electrical connection between the floating diffusion region FD and the second gate electrode 450B through the wiring layer 472 and the via contact 476. Additional jumper structures FDJP may electrically connect the first gate electrode 450A to the floating diffusion region FD and/or may electrically connect the third gate electrode 450C to the floating diffusion region FD.

In embodiments of the present disclosure, the first gate electrode 450A may be a reset gate RG, the second gate electrode 450B may be a source follower gate SF, and the third gate electrode 450C may be a selection gate SEL. However, the first to third gate electrodes 450A, 450B, and 450C are not necessarily limited thereto.

In embodiments of the present disclosure, a contact 460 and a wiring layer 472 may be disposed on a top surface and the side wall of the semiconductor pattern AP to provide electrical connection required for implementing a pixel circuit of the image sensor 400. For example, when the first gate electrode 450A is a reset gate RG, the second gate electrode 450B is a source follower gate SF, and the third gate electrode 450C is a selection gate SEL, an output signal Vout may be provided to a source/drain region SD2 disposed in an upper portion of the semiconductor pattern AP and an input signal Vpix may be provided to a part of the semiconductor pattern AP between the source follower gate SF and the reset gate RG.

According to embodiments of the present disclosure, the first to third gate electrodes 450A, 450B, and 450C may be disposed on the side wall of the semiconductor pattern AP extending in the vertical direction Z to be spaced apart from one another in the vertical direction Z and the first to third gate electrodes 450A, 450B, and 450C may have a gate-all-around structure. Therefore, leakage current of the pixel circuits such as the reset gate RG, the selection gate SEL, and the source follower gate SF may be reduced and read noise may be reduced or prevented from being generated. Therefore, the image sensor 400 may have high image quality. In addition, because the pixel circuits may be stacked in the vertical direction Z, an area of a unit pixel may be reduced and the image sensor 400 may be miniaturized.

Figure 17:
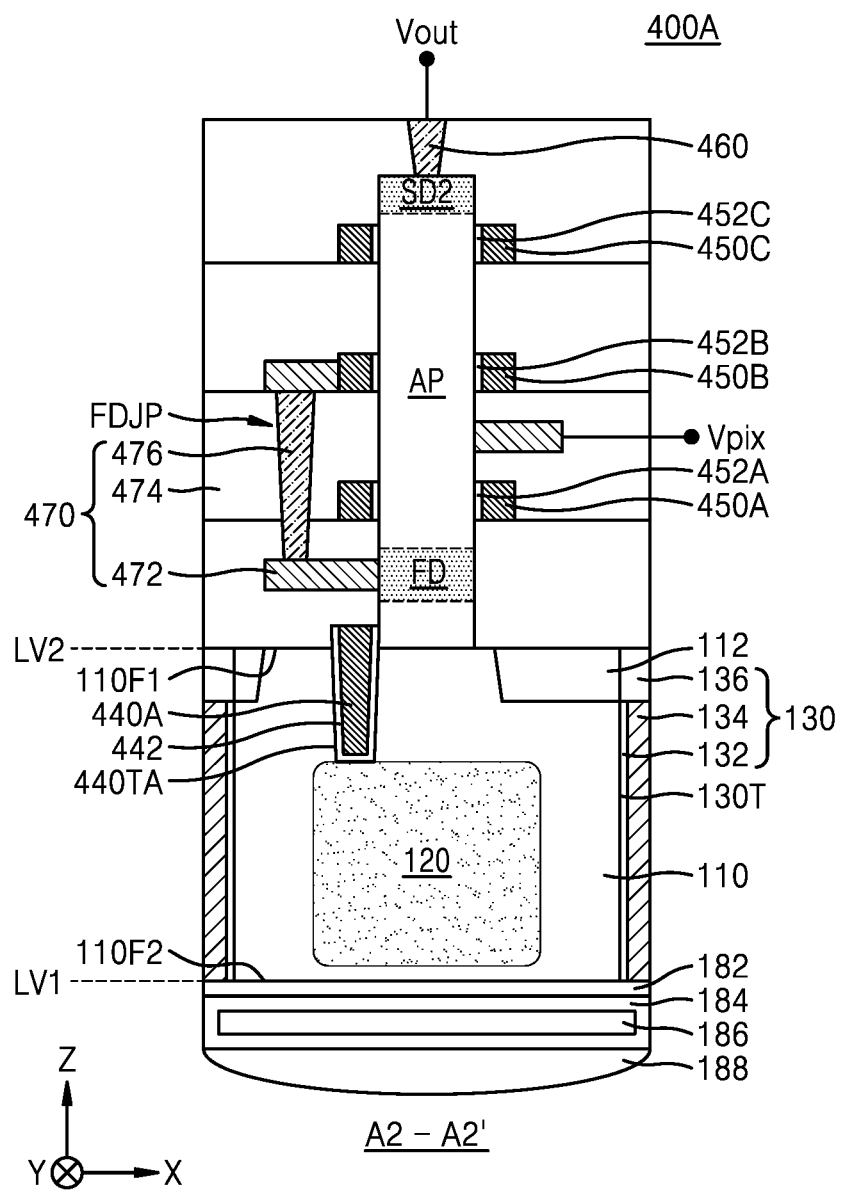
FIG. 17 is a cross-sectional view illustrating an image sensor according to an embodiment of the present disclosure.

FIG. 17 is a cross-sectional view illustrating an image sensor 400A according to an embodiment of the present disclosure. In FIG. 17, the same reference numerals as those of FIGS. 1 to 16 may be used to denote the same components.

Referring to FIG. 17, a transmission gate trench 440TA may extend from a first surface 110F1 of a semiconductor substrate 110 to an inside of the semiconductor substrate 110 and a buried transmission gate electrode 440A may be disposed in the transmission gate trench 440TA. The buried transmission gate electrode 440A may cover a lower side wall of a semiconductor pattern AP and at least a part of the buried transmission gate electrode 440A may vertically overlap first to third gate electrodes 450A, 450B, and 450C. The buried transmission gate electrode 440A may have a square, rectangular, circular, or elliptical horizontal cross-section.

As illustrated in FIG. 17, a floating diffusion region FD may be disposed in a part of the semiconductor pattern AP, for example, at a vertical level lower than that of a bottom surface of the first gate electrode 450A and a vertical level higher than that of a top surface of the buried transmission gate electrode 440A.

Figure 18:
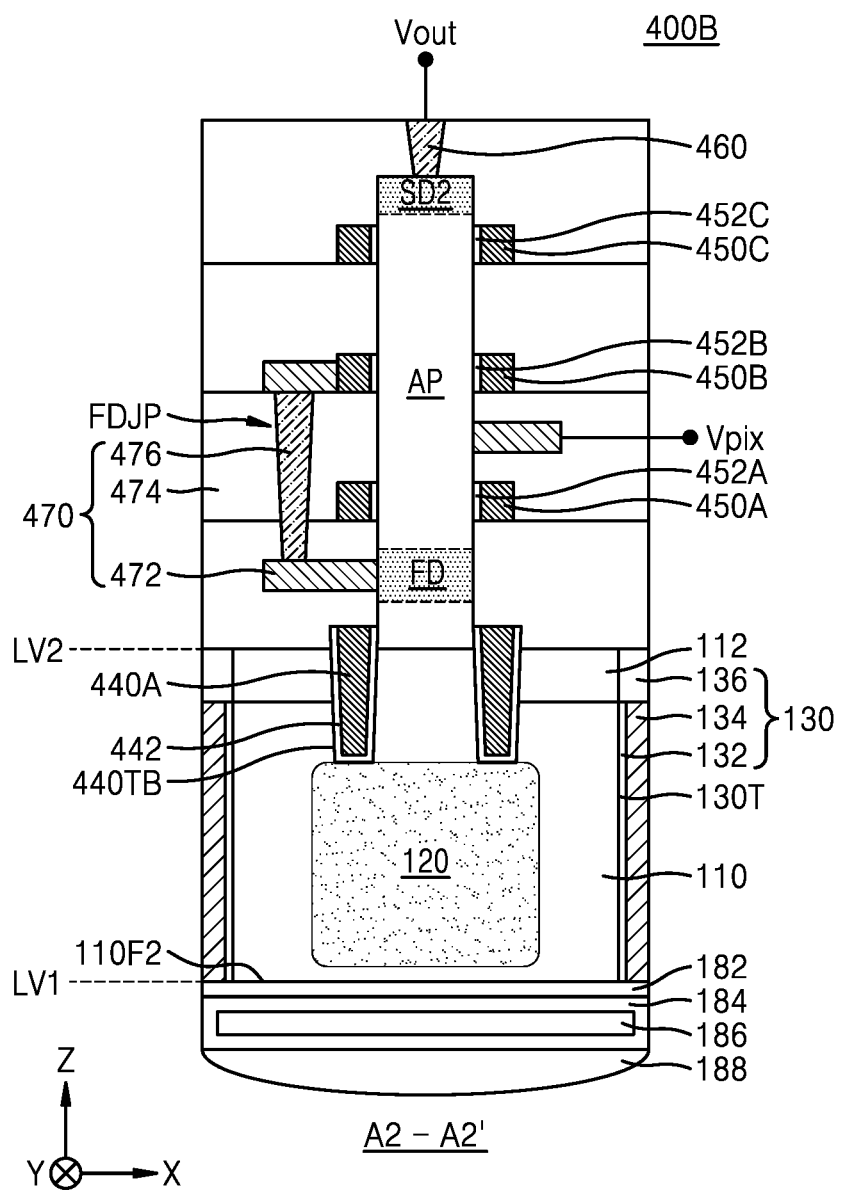
FIG. 18 is a cross-sectional view illustrating an image sensor according to an embodiment of the present disclosure.

FIG. 18 is a cross-sectional view illustrating an image sensor 400B according to an embodiment of the present disclosure. In FIG. 18, the same reference numerals as those of FIGS. 1 to 17 may be used to denote the same components.

Referring to FIG. 18, a transmission gate trench 440TB may have a ring-shaped horizontal cross-section and a lower side wall of a semiconductor pattern AP may extend to an internal wall of the transmission gate trench 440TB. For example, the buried transmission gate electrode 440B may be disposed in the transmission gate trench 440TB to cover the lower side wall of the semiconductor pattern AP. The buried transmission gate electrode 440B may vertically overlap first to third gate electrodes 450A, 450B, and 450C.

As illustrated in FIG. 18, a floating diffusion region FD may be disposed in a part of the semiconductor pattern AP, for example, at a vertical level lower than that of a bottom surface of the first gate electrode 450A and a vertical level higher than that of a top surface of the buried transmission gate electrode 440B.

FIG. 19 is a schematic diagram illustrating an image sensor 500 according to an embodiment of the present disclosure.

Referring to FIG. 19, the image sensor 500 may be a stacked image sensor including a first chip C1 and a second chip C2 stacked in the vertical direction. The first chip C1 may include an active pixel region APR and a first pad region PDR1 and the second chip C2 may include a peripheral circuit region PCR and a second pad region PDR2.

A plurality of first pads PDR1 of the first pad region PDR1 may transmit and receive an electrical signal to and from an external device. The peripheral circuit region PCR may include a logic circuit block LC and a plurality of complementary metal-oxide-semiconductor (CMOS) transistors. The peripheral circuit region PCR may provide a constant signal to each active pixel PX of the active pixel region APR or may control an output signal in each active pixel PX. The plurality of first pads PAD1 in the first pad region PDR1 may be electrically connected a plurality of second pads PAD2 in a second pad region PDR2 by a via structure VS.

Figure 20:
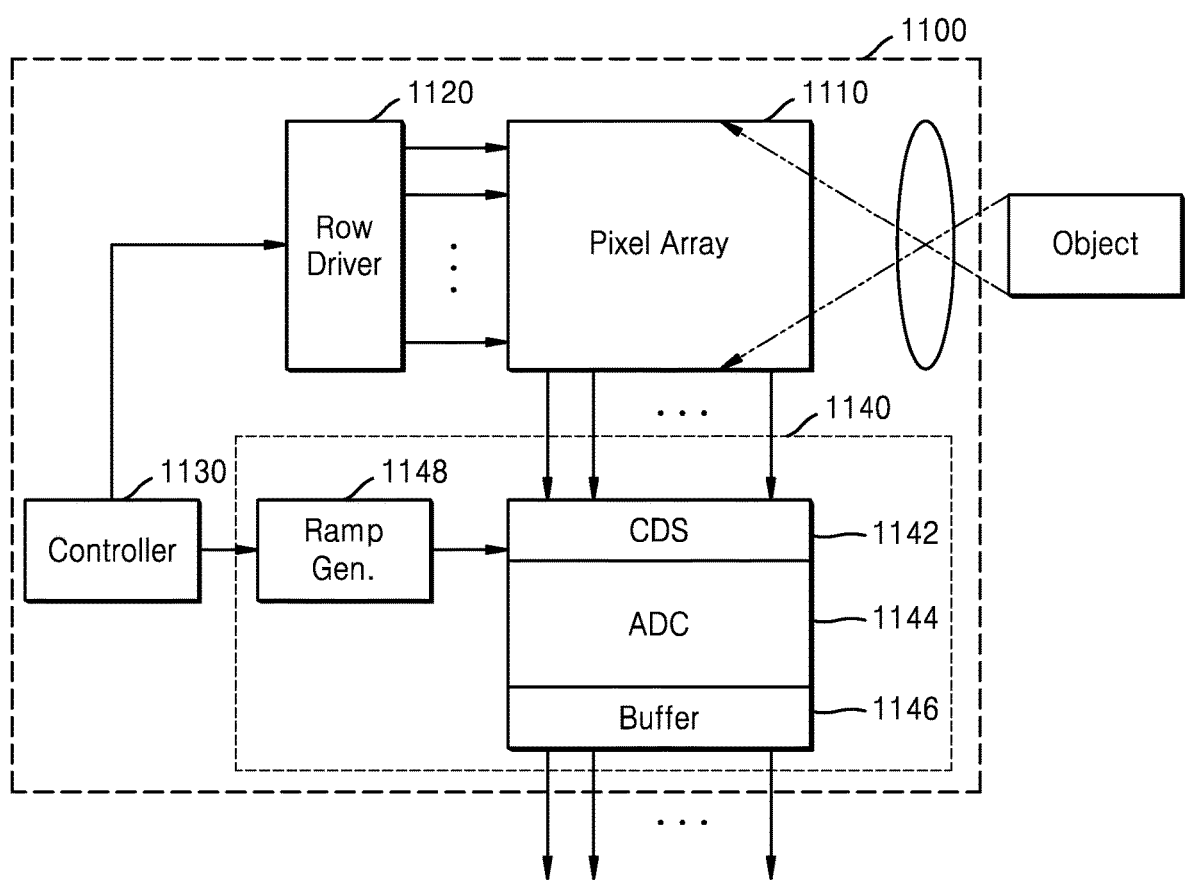
FIG. 20 is a block diagram illustrating a configuration of an image sensor according to an embodiment of the present disclosure.

FIG. 20 is a block diagram illustrating a configuration of an image sensor 1100 according to an embodiment of the present disclosure.

Referring to FIG. 20, the image sensor 1100 may include a pixel array 1110, a controller 1130, a low driver 1120, and a pixel signal processing unit 1140. The image sensor 1100 includes at least one of the image sensors 100, 100A, 100B, 100C, 200, 200A, 300, 300A, 400, 400A, 400B, and 500 described in FIGS. 1 to 19.

The pixel array 1110 may include a plurality of two-dimensionally disposed unit pixels and each unit pixel may include an organic photoelectric conversion element. The photoelectric conversion element may absorb light to generate charge and an electrical signal (an output voltage) in accordance with the generated charge may be provided to the pixel signal processing unit 1140 through a vertical signal line. Unit pixels included in the pixel array 1110 may provide an output voltage one at a time in units of rows so that unit pixels belonging to one row of the pixel array 1110 may be simultaneously activated by a selection signal output by the row driver 1120. Unit pixels belonging to a selected row may provide an output voltage in accordance with absorbed light to an output line of a corresponding column.

The controller 1130 may control the row driver 1120 to have the pixel array 1110 absorb light and accumulate charge, temporarily store the accumulated charge, and output an electrical signal in accordance with the stored charge to the outside of the pixel array 1110. In addition, the controller 1130 may control the pixel signal processing unit 1140 to measure the output voltage provided by the pixel array 1110.

The pixel signal processing unit 1140 may include a correlation double sampler (CDS) 1142, an analog-to-digital converter (ADC) 1144, and a buffer 1146. The CDS 1142 may sample and hold the output voltage provided by the pixel array 1110. The CDS 1142 may double sample a specific noise level and a level in accordance with the generated output voltage to output a level corresponding to a difference between the specific noise level and the level in accordance with the generated output voltage. In addition, the CDS 1142 may receive a ramp signal generated by a ramp signal generator 1148, may compare the level with the ramp signal, and may output a comparison result.

The ADC 1144 may convert an analog signal corresponding to the level received from the CDS 1142 into a digital signal. The buffer 1146 may latch the digital signal and the latched signal may be output to the outside of the image sensor 1100 to be transmitted to an image processor.

While the inventive concept has been particularly shown and described with reference to embodiments thereof, it will be understood that various changes in form and details may be made therein without departing from the spirit and scope of the present disclosure.

What is claimed is:

1. An image sensor, comprising:
   a semiconductor substrate including a first surface and a second surface opposite to the first surface;
   a semiconductor pattern disposed on the first surface of the semiconductor substrate;
   a buried transmission gate electrode disposed in a transmission gate trench extending from the first surface of the semiconductor substrate to an interior of the semiconductor substrate; and
   a first gate electrode having a ring-shaped horizontal cross-section and at least partially surrounding a side wall of the semiconductor pattern.

2. The image sensor of claim 1, wherein the first gate electrode is spaced apart from the buried transmission gate electrode in a second direction parallel to the first surface.

3. The image sensor of claim 1, wherein the first gate electrode comprises:
   a main electrode portion extending on the side wall of the semiconductor pattern in a first direction perpendicular to the first surface; and
   an extension portion disposed on the first surface of the semiconductor substrate and extending from the main electrode portion in a horizontal direction.

4. The image sensor of claim 3, further comprising:
a first source/drain region disposed in the semiconductor substrate under the semiconductor pattern; and
a second source/drain region disposed in an upper portion of the semiconductor pattern.

5. The image sensor of claim 4, further comprising:
a first contact disposed on the first surface of the semiconductor substrate and electrically connected to the first source/drain region;
a second contact disposed on the extension portion of the first gate electrode; and
a third contact disposed on a top surface of the semiconductor pattern and electrically connected to the second source/drain region.

6. The image sensor of claim 1, further comprising a floating diffusion region adjacent to the transmission gate trench in the semiconductor substrate,
wherein the transmission gate trench has a ring-shaped horizontal cross-section and at least partially surrounds the floating diffusion region.

7. The image sensor of claim 1, wherein a top surface of the semiconductor pattern is at a higher level than a top surface of the buried transmission gate electrode.

8. The image sensor of claim 1, further comprising a second gate electrode at least partially surrounding the side wall of the semiconductor pattern and being spaced apart from the first gate electrode in a first direction perpendicular to the first surface.

9. The image sensor of claim 8, wherein each of the first gate electrode and the second gate electrode has a ring-shaped horizontal cross-section, and
wherein the first gate electrode and the second gate electrode vertically overlap each other.

10. The image sensor of claim 8, wherein the transmission gate trench has a ring-shaped horizontal cross section, and
wherein a lower side wall of the semiconductor pattern extends to an interior side wall of the transmission gate trench.

11. The image sensor of claim 8, further comprising a floating diffusion region disposed in the semiconductor pattern at a level lower than a bottom surface of the first gate electrode and higher than a top surface of the buried transmission gate electrode.

12. An image sensor, comprising:
a semiconductor substrate including a first surface and a second surface opposite to the first surface;
a buried transmission gate electrode disposed in a transmission gate trench extending from the first surface of the semiconductor substrate to an interior of the semiconductor substrate;
a semiconductor pattern disposed on the first surface of the semiconductor substrate; and
a first gate electrode disposed on a side wall of the semiconductor pattern and including a main electrode portion extending in a first direction perpendicular to the first surface and an extension portion connected to the main electrode portion and extending onto the first surface of the semiconductor substrate.

13. The image sensor of claim 12, further comprising:
a first source/drain region disposed in the semiconductor substrate under the semiconductor pattern;
a second source/drain region disposed in an upper portion of the semiconductor pattern;
a first contact disposed on the first surface of the semiconductor substrate and electrically connected to the first source/drain region;
a second contact disposed on the extension portion of the first gate electrode; and
a third contact disposed on a top surface of the semiconductor pattern and electrically connected to the second source/drain region.

14. The image sensor of claim 12, further comprising a floating diffusion region adjacent to the transmission gate trench in the semiconductor substrate,
wherein the first gate electrode is spaced apart from the buried transmission gate electrode in a second direction parallel with the first surface.

15. The image sensor of claim 14, wherein the transmission gate trench has a ring-shaped horizontal cross-section and at least partially surrounds the floating diffusion region.

16. The image sensor of claim 12, a second gate electrode at least partially surrounding the side wall of the semiconductor pattern and being apart from the first gate electrode in the first direction; and
a third gate electrode at least partially surrounding the side wall of the semiconductor pattern and being spaced apart from the second gate electrode in the first direction.

17. The image sensor of claim 16, wherein each of the second gate electrode and the third gate electrode has a ring-shaped horizontal cross-section, and
wherein the first gate electrode, the second gate electrode, and the third gate electrode vertically overlap one another.

18. The image sensor of claim 12, further comprising a floating diffusion region disposed in the semiconductor pattern at a level that is lower than a bottom surface of the first gate electrode and higher than a top surface of the buried transmission gate electrode.

19. The image sensor of claim 12, wherein the transmission gate trench has a ring-shaped horizontal cross section, and
wherein a lower side wall of the semiconductor pattern extends to an interior side wall of the transmission gate trench.

20. An image sensor, comprising:
a semiconductor substrate including a first surface and a second surface opposite to the first surface;
a semiconductor pattern disposed on the first surface of the semiconductor substrate;
a device isolation layer disposed on the first surface of the semiconductor substrate and defining an active region;
a buried transmission gate electrode spaced apart from the semiconductor pattern in a second direction parallel with the first surface of the semiconductor substrate and disposed in a transmission gate trench extending to an interior of the semiconductor substrate;
a first gate insulating layer at least partially surrounding a side wall of the semiconductor pattern;
a first gate electrode including a main electrode portion at least partially surrounding the side wall of the semiconductor pattern on the first gate insulating layer and having a ring-shaped horizontal cross-section;
a first source/drain region disposed in the semiconductor substrate under the semiconductor pattern; and
a second source/drain region disposed in an upper portion of the semiconductor pattern.

* * * * *